United States Patent
Suzuki et al.

(10) Patent No.: US 6,768,113 B2
(45) Date of Patent: Jul. 27, 2004

(54) WORKPIECE HOLDER, SEMICONDUCTOR FABRICATING APPARATUS, SEMICONDUCTOR INSPECTING APPARATUS, CIRCUIT PATTERN INSPECTING APPARATUS, CHARGED PARTICLE BEAM APPLICATION APPARATUS, CALIBRATING SUBSTRATE, WORKPIECE HOLDING METHOD, CIRCUIT PATTERN INSPECTING METHOD, AND CHARGED PARTICLE BEAM APPLICATION METHOD

(75) Inventors: Hiroyuki Suzuki, Hitachinaka (JP); Hiroyuki Shinada, Chofu (JP); Atsuko Takafuji, Nerima-ku (JP); Yasutsugu Usami, Hitachinaka (JP); Shuji Sugiyama, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/309,275

(22) Filed: Dec. 26, 2002

(65) Prior Publication Data

US 2003/0146382 A1 Aug. 7, 2003

Related U.S. Application Data

(62) Division of application No. 09/292,626, filed on Apr. 15, 1999, now Pat. No. 6,509,564.

(30) Foreign Application Priority Data

Apr. 20, 1998 (JP) .......................... 10-108972
May 18, 1998 (JP) .......................... 10-135404

(51) Int. Cl.[7] .............................. H01J 37/26
(52) U.S. Cl. ............... 250/310; 250/306; 250/307; 438/16; 438/401
(58) Field of Search .............. 250/310, 306–307; 438/16, 401, 396, 394, 22; 356/401

(56) References Cited

U.S. PATENT DOCUMENTS

| | | | |
|---|---|---|---|
| 4,376,692 A | 3/1983 | Tsukada et al. | 204/298 |
| 4,390,788 A | 6/1983 | Hayashi et al. | 250/491.1 |
| 4,396,901 A | 8/1983 | Saitou et al. | 382/8 |

(List continued on next page.)

FOREIGN PATENT DOCUMENTS

| | | |
|---|---|---|
| JP | 56-087670 | 7/1981 |
| JP | 56-103420 | 8/1981 |
| JP | 59-192943 | 11/1984 |

(List continued on next page.)

OTHER PUBLICATIONS

J. Vac.Sci. Technol. B 9 (6), Nov./Dec. 1991; P. Sandland et al.: *An electron–beam inspection system for x-ray mask production*, May 28, 1991.

(List continued on next page.)

*Primary Examiner*—John R. Lee
*Assistant Examiner*—Zia R. Hashmi
(74) *Attorney, Agent, or Firm*—Kenyon & Kenyon

(57) ABSTRACT

Heights of a sample are calibrated by setting a calibrating substrate on a stage and then irradiating a charged particle beam onto standard marks provided on at least two kinds of surfaces having different substrate heights. Secondary charged particles produced from said irradiated standard marks on the substrate are and detected and a surface height of the irradiated portion of the substrate measured. The difference in height between the standard marks is set to be in a range containing an extent, over the entire sample, to which the height of the sample varies due to warping.

2 Claims, 16 Drawing Sheets

U.S. PATENT DOCUMENTS

| | | | |
|---|---|---|---|
| 4,400,235 A | | 8/1983 | Coquin et al. ............... 156/643 |
| 4,442,188 A | * | 4/1984 | Chiang ........................... 430/5 |
| 4,871,420 A | | 10/1989 | Alexander et al. ........... 156/643 |
| 4,975,586 A | | 12/1990 | Ray ......................... 250/492.2 |
| 5,389,787 A | | 2/1995 | Todokoro et al. ............ 250/310 |
| 5,466,940 A | | 11/1995 | Litman et al. ............... 250/397 |
| 5,502,306 A | | 3/1996 | Meisburger et al. ......... 250/310 |
| 5,578,821 A | | 11/1996 | Meisburger et al. ......... 250/310 |
| 5,665,968 A | * | 9/1997 | Meisburger et al. ......... 250/310 |
| 5,670,782 A | | 9/1997 | Sato ............................ 250/310 |
| 5,717,204 A | | 2/1998 | Meisburger et al. ......... 250/310 |
| 5,840,595 A | * | 11/1998 | Kobayashi .................... 438/16 |
| 5,986,263 A | | 11/1999 | Hiroi et al. .................. 250/310 |

FOREIGN PATENT DOCUMENTS

| | | |
|---|---|---|
| JP | 60-167245 | 8/1985 |
| JP | 61-119685 | 6/1986 |
| JP | 61-119686 | 6/1986 |
| JP | 61-142752 | 6/1986 |
| JP | 61-143930 | 7/1986 |
| JP | 64-28386 | 1/1989 |
| JP | 2-142045 | 5/1990 |
| JP | 2-278643 | 11/1990 |
| JP | 3-079158 | 8/1991 |
| JP | 4-10343 | 1/1992 |
| JP | 5-258703 | 10/1993 |
| JP | 6-139985 | 5/1994 |
| JP | 6-188294 | 7/1994 |
| JP | 8-124513 | 5/1996 |

OTHER PUBLICATIONS

J. Vac.Sci. Technol. B 9 (6), Nov./Dec. 1991; W.D. Meisburger et al.: *Requirements and performance of an electron–beam column designed for x–ray mask inspection*, May 30, 1991.

J. Vac.Sci. Technol. B, vol. 10, No. 6, Nov./Dec. 1992; W.D. Meisburger et al.: *Low–voltage electron–optical system for the high–speed inspection of integrated circuits*, May 27, 1992.

SPIE, vol. 2439, Reprinted from *Integrated Circuit Metrology, Inspection, and process Control IX*, Feb. 20–22, 1995, Santa Clara, Cal., pp. 174–183, Douglas Hendricks et al.: *Characterization of a New Automated Electron–Beam Wafer Inspection System*.

Edited by 132nd Committee of Japan Scoiety for the Promotion of Science, *Electron and Ion Beam Handbook* 2nd Edition, The Nikkan Kogyo Shimbun, Ltd., pp. 622–623, 1986.

* cited by examiner

FIG. 6
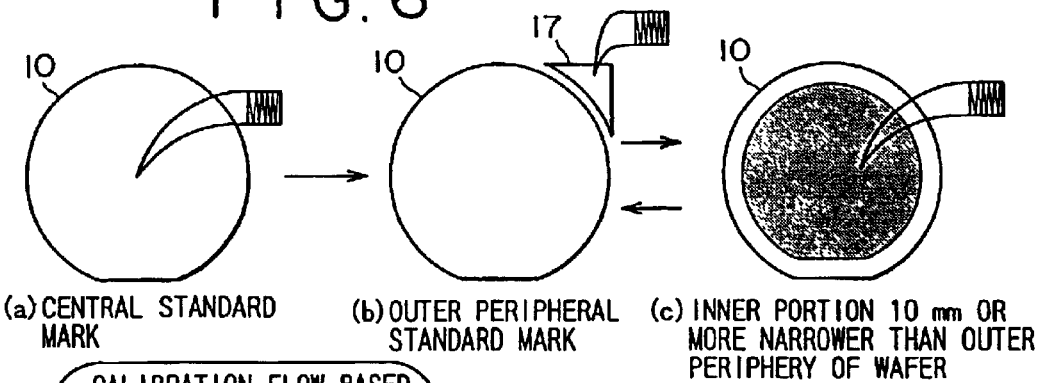
(a) CENTRAL STANDARD MARK
(b) OUTER PERIPHERAL STANDARD MARK
(c) INNER PORTION 10 mm OR MORE NARROWER THAN OUTER PERIPHERY OF WAFER
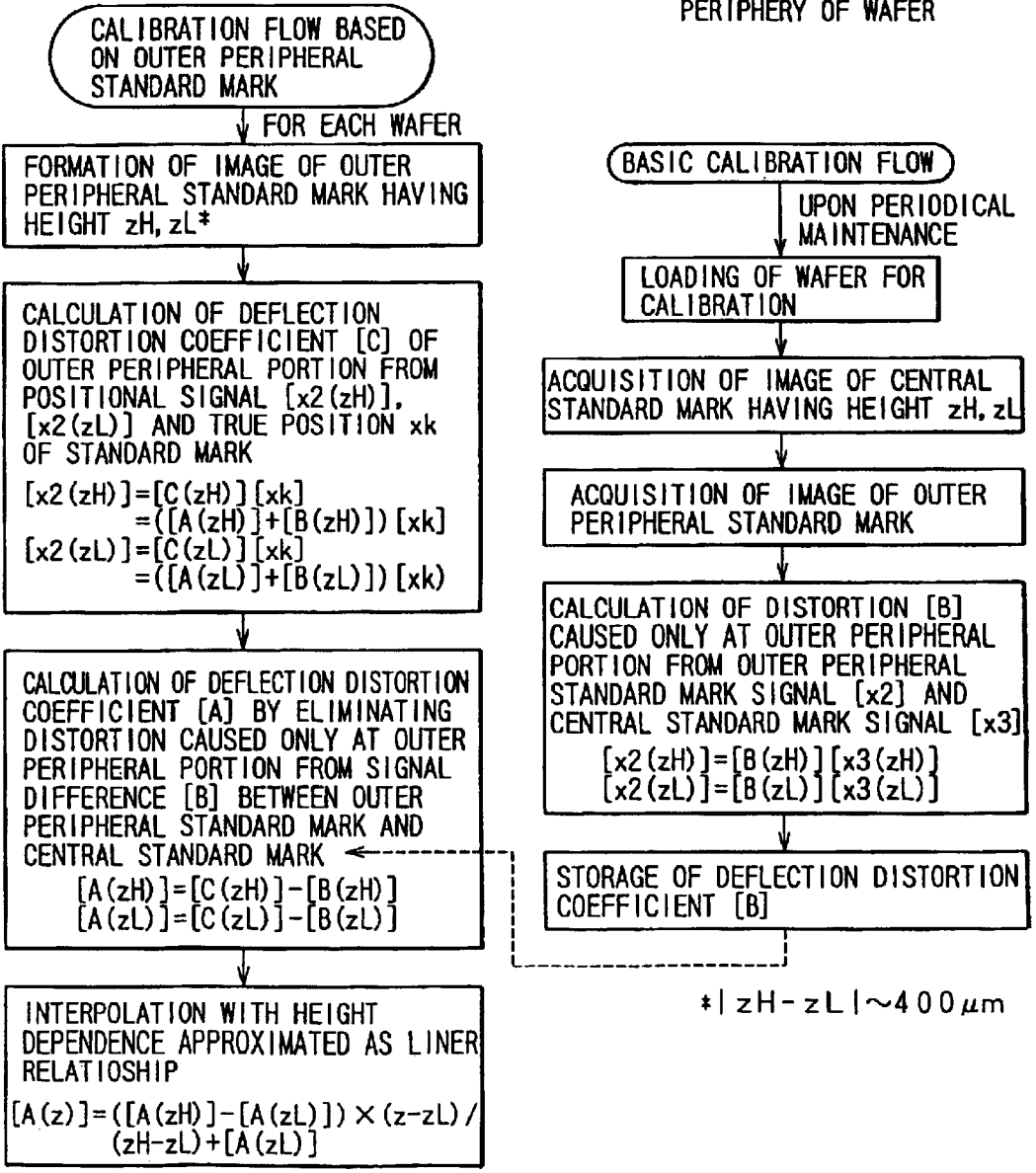

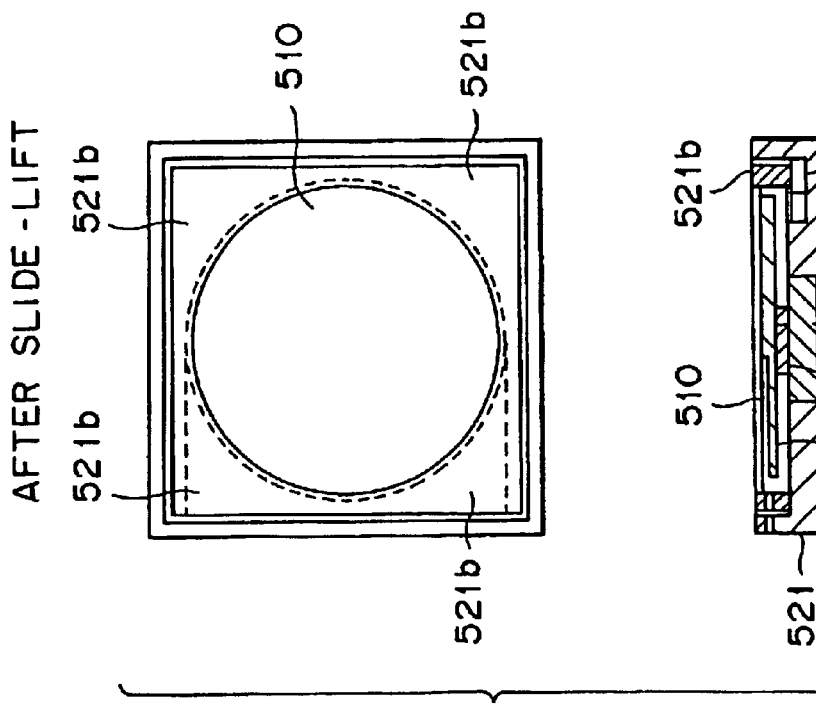
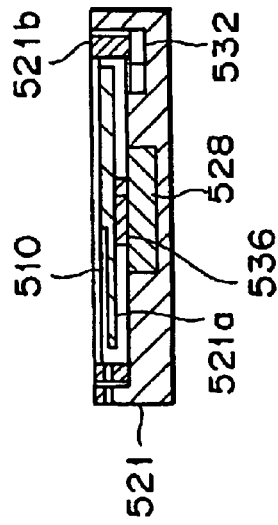
FIG. 12A BEFORE SLIDE-LIFT
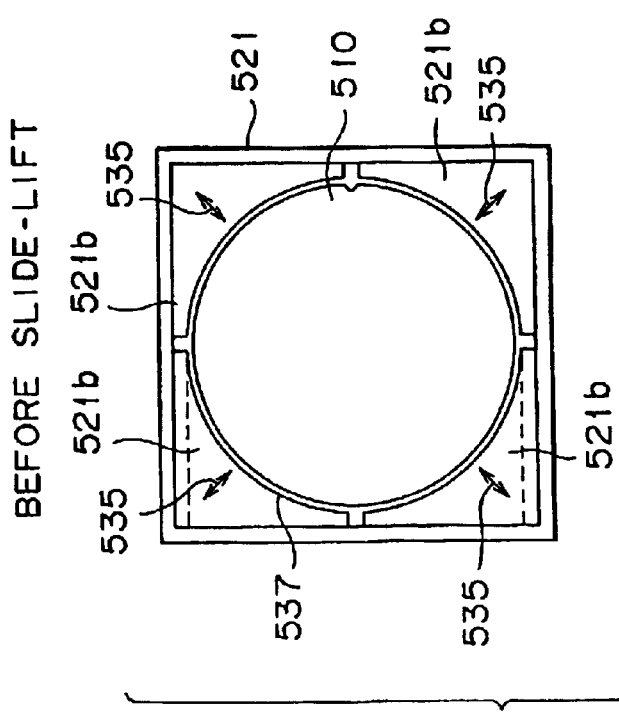
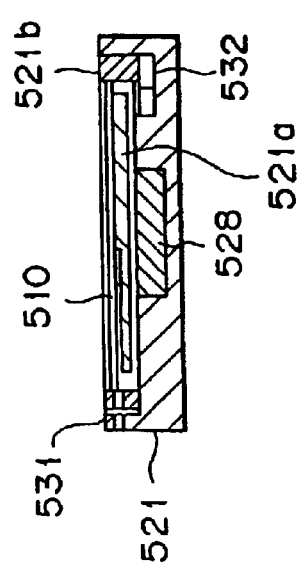
FIG. 12B AFTER SLIDE-LIFT

POSITION OF CLAW

A-A CROSS SECTION

A-A CROSS SECTION

WORKPIECE HOLDER, SEMICONDUCTOR FABRICATING APPARATUS, SEMICONDUCTOR INSPECTING APPARATUS, CIRCUIT PATTERN INSPECTING APPARATUS, CHARGED PARTICLE BEAM APPLICATION APPARATUS, CALIBRATING SUBSTRATE, WORKPIECE HOLDING METHOD, CIRCUIT PATTERN INSPECTING METHOD, AND CHARGED PARTICLE BEAM APPLICATION METHOD

This is a division of application Ser. No. 09/292,626 filed Apr. 15, 1999 now U.S. Pat. No. 6,509,564.

FIELD OF THE INVENTION

The present invention relates to a workpiece holder for holding a workpiece such as a semiconductor wafer, a semiconductor fabricating apparatus having the workpiece holder, a semiconductor inspecting apparatus, a circuit pattern inspecting apparatus, a charged particle beam application apparatus, a calibrating substrate, a workpiece holding method, a circuit pattern inspecting method, and a charged particle beam application method.

BACKGROUND OF THE INVENTION

With the trend toward finer-geometries of circuit-patterns of semiconductor wafers, a circuit pattern inspecting apparatus employing electron beams has come to be put into practical use.

Techniques concerning such a circuit pattern inspecting apparatus have been described, for example, in Japanese Patent Laid-open No. Sho 59-192943, Japanese Patent Laid-open No. Hei 05-258703, Sandland, et al., "An electron-beam inspection system for x-ray mask production", J. Vac. Sci. Tech. B, Vol. 9, No. 6, pp. 3005–3009 (1991), Meisburger, et al., "Requirements and performance of an electron-beam column designed for x-ray mask inspection", J. Vac. Sci. Tech. B, Vol. 9, No. 6, pp. 3010–3014 (1991), Meisburger, et al., "Low-voltage electron-optical system for the high-speed inspection of integrated circuits", J. Vac. Sci. Tech. B, Vol. 10, No. 6, pp. 2804–2808 (1992), Hendricks, et al., "Characterization of a New Automated Electron-Beam Wafer Inspection System", SPIE Vol. 2439, pp. 174–183 (Feb. 20–22, 1995).

To inspect a circuit pattern, which comes to be formed in finer-geometries on a wafer having an increased diameter, highly accurately at a high throughput, it is necessary to acquire a pattern image with a higher SN ratio at a very higher speed. To satisfy such a requirement, it is required to keep a higher SN ratio by ensuring the necessary number of electrons to be emitted to the circuit pattern using a large current beam which is equal to or more than 100 times (10 nA or more) that used for a usual scanning electron microscope (SEM), and further, it is essential to highly efficiently detect secondary electrons produced from a substrate and reflection electrons reflected therefrom at a higher speed.

On the other hand, to prevent a semiconductor substrate having an insulating film such as a resist from being affected by electrification, the semiconductor substrate is irradiated with a low acceleration electron beam of 2 KeV or less. The technique is described on pages 622–623 in"Electron and Ion Beam Handbook" 2nd Edition, edited by 132nd committee of Japan Society for the Promotion of Science, published by Nikkan Kogyo Simbun, Ltd. (1986). A large current and low acceleration electron beam, however, makes it difficult to observe a circuit pattern at a high resolution because it produces aberration due to the space-charge effect.

A method of solving such a problem has been known in which a high acceleration electron beam is retarded directly before a workpiece to irradiate the workpiece with a substantially low acceleration electron beam. The technique has been described, for example, in Japanese Patent Laid-open Nos. Hei 02-142045 and Hei, 06-139985.

The outline of one example of an electro-optical system of a prior art circuit pattern inspecting apparatus will be described below with reference to FIG. 9. FIG. 9 is a schematic view of an electro-optical system of the prior art circuit pattern inspecting apparatus.

A primary electron beam 201 emitted from an electron gun 1 with a voltage applied to an extraction electrode 2 passes through a condenser lens 3, a scanning deflector 5, an aperture 6, an objective lens 9 and the like to be converged and deflected onto a substrate 10 for a semiconductor device placed on workpiece stages 11 and 12. To retard the primary electron beam 201, a retarding voltage is applied from a high voltage power source 23 to the substrate 10. The irradiation of the substrate 10 with the primary electron beam 201 produces secondary electrons 202 from the substrate 10. The secondary electrons 202 are accelerated to an energy of several KeV by the retarding voltage. An EXB deflector 8 is provided on the electron gun side of the objective lens 9 in such a manner as to be adjacent to the objective lens 9.

The EXB deflector 8 is adapted to cancel the deflection amounts of the primary electron beam 201 due to an electric field and a magnetic field each other and to deflect the secondary electrons 202 by superimposition of the deflection amounts of the secondary electrons 202 due to the electric field and magnetic field. The accelerated secondary electrons 202 thus deflected by the EXB deflector 8 is attracted by an electric field formed by an attraction voltage applied between a detector 13 and an attraction electrode 14 mounted around the detector 13, to enter the detector 13.

The detector 13 is configured as a semiconductor detector. The secondary electrons 202 having entered the semiconductor detector produce electron-positive hole pairs which are then taken out as a current to be converted into an electric signal. The output signal is amplified by a pre-amplifier 21, to become a brilliance modulation input for forming an image signal. After an image of one region of the substrate is acquired by the above operation of the electro-optical system, the image output signal is delayed for a time corresponding to one image plane, and then an image of a second region is similarly acquired. These two images are compared with each other by an image comparing/evaluating circuit, to thus detect a defective portion of the circuit pattern. Here, the irradiated position with the primary electron beam 201 is determined as a position of the substrate on which the electron beam is impinged on the basis of a scanning-deflection signal inputted in the scanning deflector 5.

If the surface height of the substrate is varied by warping of the wafer or the like, however, the irradiated region of the substrate with an electron beam is substantially varied although the electron beam is scanned on the basis of the same deflection signal, that is, the same beam deflection cannot be obtained between two irradiated regions of the substrate.

To solve such a problem, a prior art electron beam application apparatus such as an electron beam plotting apparatus has adopted the following deflection correcting manner:

(1) A sample with standard marks formed on at least two surfaces different in thickness is provided at the outermost peripheral portion of a workpiece stage, and a positional offset between image signals obtained from the standard marks having the different heights is calculated.

(2) The height of each standard mark is converted into a signal by operating an optical sensor for successively measuring the surface height of the workpiece.

(3) A deflection correcting table corresponding to the height is calculated on the basis of the height signal of each standard mark and the positional offset between image signals of the standard marks. The deflection correcting table is stored, and upon observation of the substrate, the deflection is corrected by calculating a deflection correcting signal corresponding to the surface height of the substrate on the basis of the deflection correcting table.

With this technique, even if the surface height of a substrate is varied by warping of the wafer or the like, two regions of the substrate which are different in surface height can be equally irradiated with an electron beam on the basis of a corrected deflection signal.

The technique has been described, for example, in Japanese Patent Laid-open No. Sho 56-103420. According to this technique, the deflection correcting table can be simply updated by repeatedly observing the standard marks provided at the outer peripheral portion of the workpiece stage on which the wafer is left mounted. As a result, even if there occurs a drift of the deflection amount of a primary electron beam due to the change in the electro-optical system with the elapsed time, the deflection can be corrected in such a manner as to keep up with the change with the elapsed time by re-observing the standard marks about several ten times at a specific period of time during processing of one wafer, and updating the deflection correcting table for each re-observation.

A circuit pattern inspecting apparatus adopting the above-described deflection correcting method, however, has been not realized so far.

The gist of the present invention is to provide a circuit pattern inspecting apparatus adopting the above-described deflection correcting method for coping with the warping of a wafer. However, if the circuit pattern inspecting apparatus adopts the above deflection correcting method as it is, there occurs the following problems:

Since a retarding voltage is applied to a substrate, a primary electron beam is affected by an electric field caused by the retarding voltage directly before reaching the substrate.

In general, since a change in electric field is distributed axisymmetrically with respect to the central axis of the primary electron beam, the primary electron beam can be deflected to a desired region by uniformly adjusting the deflection sensitivity irrespective of the position of the wafer. However, at the outer peripheral portion of the wafer, there is produced a nonaxisymmetric disturbance of an electric field caused by the retarding voltage due to the sectional shape of the wafer itself and the sectional structure of an end portion of the workpiece stage on which the water is mounted.

In the circuit pattern inspecting apparatus, since a signal is obtained by one large current scanning only, a retarding voltage being as high as several times or more that used for another electron beam application apparatus is required to restrict the beam diameter into a desired value and to allow a low acceleration electron beam to be impinged on the substrate. Accordingly, the amount of change in electric field caused by the retarding voltage becomes larger than that for another electron beam application apparatus.

As a result, depending on whether or not an observation region of the substrate, that is, an irradiated region with a primary electron beam is located near the outer peripheral portion of the wafer, there occurs an unnegligible difference of the beam, called "beam deflection", between the two irradiated regions located near the outer peripheral portion and in the central portion of the wafer although these regions are irradiated with the primary electron beam on the basis of the same deflection signal.

In such circumstances, even if a deflection correcting table is prepared by providing, like another electron beam application apparatus, standard marks formed on at least two surfaces different in thickness at the outermost peripheral portion of a workpiece stage, the deflection correcting table is affected by the beam distortion inherent to the outer peripheral portion of the workpiece stage. As a result, a suitable deflection correcting signal for the associated position cannot be obtained by referring to the deflection correcting table on the basis of the measurement result of the surface height of the workpiece at the central portion of the workpiece stage, giving rise to a problem in which there occurs a deviation in irradiated position with the electron beam.

The deviation in irradiated position with the electron beam leads to a deviation in pixel in an image signal obtained from the deviated position, thereby causing degradation of the accuracy in comparative inspection of the images. If the deviation in pixel exceeds a specific allowable range, there occurs a problem that the inspection accuracy is critically degraded in the circuit pattern inspecting apparatus aimed at comparative inspection of images.

On the other hand, of a semiconductor fabricating apparatus and a semiconductor inspecting apparatus, an electron beam application apparatus for processing a workpiece by irradiating a workpiece with an electron beam or inspecting the workpiece using an electron beam is required to emit an electron beam in vacuum. Further, to improve the processing accuracy of a workpiece or improving the resolution of an image obtained upon inspection, it is required to control the irradiation energy intensity of the emitted electron beam.

In recent years, the electron beam application apparatus such as an electron beam plotting apparatus for processing a pattern of a semiconductor by irradiating it with an electron beam, a length measuring SEM (scanning electron microscope) for measuring a width or the like of a pattern on the surface of a semiconductor, or an analyzing SEM for analyzing the material of a semiconductor by irradiating the semiconductor with an electron beam, has adopted a retarding method of applying a voltage to a workpiece for controlling the irradiation energy intensity of an electron beam. The technique has been described, for example, in Japanese Patent Laid-open Nos. Hei 05-258703 and Hei 06-188294.

However, a workpiece holder used for the electron beam application apparatus such as a length measuring SEM or analyzing SEM has failed to cope with a variation in electric field caused at an end portion of a workpiece due to a retarding voltage applied to the substrate. As a result, if it is intended to irradiate an end portion of a workpiece with an electron beam, the accuracy of the relationship between the irradiated position with the electron beam and the actual workpiece position is significantly degraded due to a variation in electric field, so that there occurs a problem that a portion near the end portion of the workpiece cannot be processed, analyzed or inspected.

SUMMARY OF THE INVENTION

A first object of the present invention is to solve the above problems of the prior art and to highly fast, stably acquire highly accurate images from irradiated positions with an electron beam on a circuit pattern at the step of fabricating a semiconductor device including an insulating material or a mixture of an insulating material and a conductive material, without occurrence of any deviation in the irradiated position in the images to be comparatively inspected, automatically comparing the images with each other thereby inspecting defects of the circuit pattern without occurrence of errors, and feeding back the result to the conditions of fabricating the semiconductor device thereby increasing the reliability of the semiconductor device and reducing the defective percentage thereof.

As a means for achieving the above object, a typical example of a circuit pattern inspecting apparatus of the present invention will be described.

The circuit pattern inspecting apparatus of the present invention basically includes an irradiation optical system for converging a primary charged particle beam while deflecting the primary charged particle beam so as to scan first and second regions of a circuit pattern of a workpiece with the primary charged particle beam; a retarding/accelerating means for retarding the primary charged particle beam, and accelerating secondary charged particles produced from the workpiece by the irradiation of the workpiece with the primary charged particle beam and reflection electrons reflected from the workpiece; a workpiece stage for holding the workpiece; a sensor for measuring the surface height of an irradiated position of the workpiece with the primary charged particle beam; a detector for detecting the secondary charged particles produced from the workpiece; and an image forming means for forming an image of the irradiated region of the workpiece from a signal detected by the detector. The apparatus further includes an outer peripheral sample having outer peripheral standard marks formed on at least two surfaces different in thickness in the direction of the axis of the primary charged particle beam, the outer peripheral sample being provided at an outer peripheral portion of a substrate mounting area of the workpiece stage; a central sample having central standard marks formed on at least two surfaces different in thickness in the direction of the axis of the primary charged particle beam, the central sample being provided at a central portion of the substrate mounting area of the workpiece stage; a storing means for storing image signals obtained from the outer peripheral standard marks of the outer peripheral sample and the central standard marks of the central sample; a computing means for computing a distortion amount of the primary charged particle beam inherent to the outer peripheral portion from the outer peripheral and central standard mark image signals; an eliminating means for eliminating the distortion amount inherent to the outer peripheral portion from the outer peripheral standard mark image signals; a storing means for preparing a deflection correcting table in accordance with the height of the workpiece on the basis of the outer peripheral standard mark image signals from, which the distortion amount has been eliminated, and storing the deflection correcting table; a deflection correcting signal generating circuit for taking out, a deflection correcting signal from the deflection correcting table in accordance with the surface height signal obtained by the sensor; and a control means for controlling to irradiate the outer peripheral sample having the outer peripheral standard marks at a desired timing to update the deflection correcting table.

In addition, preferably, a shield electrode is provided in the vicinity of the above substrate to reduce the disturbance of the electric field caused by a retarding voltage.

The function of the circuit pattern inspecting apparatus and circuit pattern inspecting method will be described below. The above circuit pattern inspecting apparatus compares the dependence of the workpiece height on the corrected amount of deflection at the central portion of the workpiece stage with that at the outer peripheral portion of a workpiece, to obtain a distortion amount inherent to the outer peripheral portion of the workpiece. Then, the dependence of height on the corrected amount of deflection at the outer peripheral portion of the workpiece is calculated by eliminating the distortion amount inherent to the outer peripheral portion from the standard mark signal of the outer peripheral portion, to obtain a deflection correcting amount at the outer peripheral portion which is equivalent to the deflection correcting amount obtained at the central portion.

Further, since a suitable deflection correcting table can be prepared only on the basis of the standard mark at the outer peripheral portion, the deflection correcting table can be updated by repeating desired times the calculation of the deflection correcting amount at the outer peripheral portion while holding the wafer on the workpiece stage. As a result, the deflection correcting table including the dependence of surface height, which is capable of keeping up with the drift of the electron beam, can be accurately obtained without reducing the throughput.

On the other hand, at the outermost peripheral portion of a wafer, there exists a region in which the deflection cannot be corrected on the basis of the same correcting table to produce the positional deviation, and if the result of image comparison at the region is outputted, there is a possibility that a large number of misdetections occur. For this reason, the present invention is configured such that the inspection is not performed in a region in which the deflection cannot be corrected on the basis of the same correcting table. This allows highly accurate inspection with no misdetection.

The provision, in the vicinity of the workpiece, of a shield electrode having the same potential as the retarding voltage of the workpiece has makes it possible to reduce the disturbance of an electric field near the workpiece, and hence to more extend a region on the wafer in which deflection can be corrected on the basis of the same correcting table.

According to the circuit pattern inspecting apparatus having the above functions, it is possible to highly fast, stably acquire highly accurate images from irradiated positions with an electron beam on a circuit pattern at the step of fabricating a semiconductor device including an insulating material or a mixture of an insulating material and a conductive material, without occurrence of any deviation in the irradiated position under a condition that a high retarding voltage is applied to a substrate, and automatically comparing the images with each other, thereby inspecting defects of the circuit pattern without occurrence of errors.

A second object of the present invention is to provide an electron beam application apparatus having a function of controlling an electron beam irradiation energy with a retarding voltage, which is capable of irradiating a position of a workpiece with an electron beam without reducing the accuracy of the irradiated position.

An electron beam application apparatus includes a vacuum chamber in which a workpiece such as a semiconductor device is irradiated with an electron beam, a loader for carrying the workpiece in the vacuum chamber, a movable stage for allowing the workpiece to be mounted thereon and adjusting an irradiated position with the electron beam, a workpiece holder disposed between the stage and the workpiece for holding the workpiece, a power source for applying a retarding voltage to the workpiece, a position measuring device for measuring the moved amount or the position of the stage, an electron source and a deflector for irradiating the workpiece with an electron beam for processing or observing the workpiece, and an information processing device for observing, analyzing, or inspecting the workpiece by making use of information obtained by detecting reflection electrons or secondary electrons produced from the workpiece. The height of a boundary portion between a portion, on the electron beam incident side, of the workpiece holder and the workpiece is set to be substantially equal to the height of the workpiece surface. With this configuration, since the electric field distribution of the workpiece surface is nearly uniform up to the end portion of the workpiece, a variation in electric field caused by the retarding voltage can be prevented. As a result, it is possible to irradiate the entire surface with an electron beam without reducing the positional accuracy.

BRIEF DESCRIPTION OF THE DRAWINGS

FIG. 6 is a flow chart illustrating an operational procedure of the circuit pattern inspecting apparatus according to the present invention, in which the plan view of a substrate to be inspected is additionally shown;

FIGS. 12A and 12B are a plan view and a vertical sectional view of a workpiece holder shown in FIG. 2, respectively;

DETAILED DESCRIPTION OF THE PREFERRED EMBODIMENTS

Hereinafter, embodiments of the present invention will be described with reference to the drawings.

First, embodiments of a circuit pattern inspecting apparatus, a circuit pattern inspecting method, and a calibration substrate according to the present invention will be described with reference to FIGS. 1 to 8.

[First Embodiment]

A circuit pattern inspecting apparatus according to one embodiment of the present invention will be described with reference to FIGS. 1 to 7.

One basic conception of the circuit pattern inspecting apparatus according to this embodiment is to accurately inspect a circuit pattern by using a deflection correcting table which is optimized in a region being as wide as possible by taking into account a disturbance of an electric field due to a retarding voltage applied to a substrate as a high negative potential, which disturbance of an electric field appears along sectional shapes of outer peripheral portions of the substrate and a workpiece stage.

Another basic conception of the circuit pattern inspecting apparatus is to provide an electrode for flattening the disturbance of an electric field caused by retarding voltage, thereby making small the correction-disable region to a degree negligible from the viewpoint of the practical use.

Figure 1:
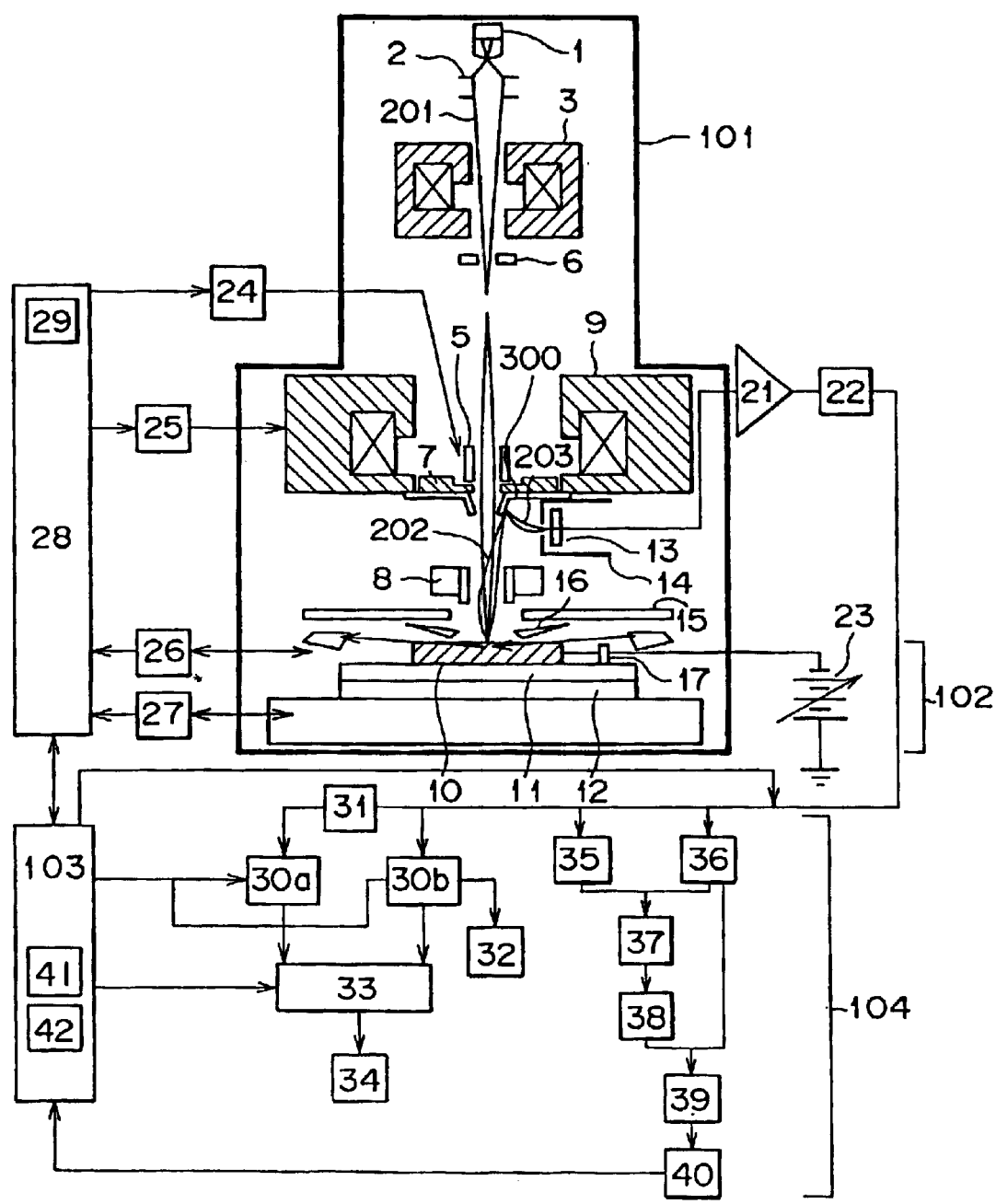
FIG. 1 is a vertical sectional view showing the configuration of a circuit pattern inspecting apparatus according to the present invention.

FIG. 1 is a vertical sectional view showing the configuration of the circuit pattern inspecting apparatus of the present invention. The circuit pattern inspecting apparatus in this embodiment will be described in detail with reference to FIG. 1. The circuit pattern inspecting apparatus basically includes an electro-optical system 101, a workpiece chamber 102, a control unit 103, and an image processing unit 104.

The electro-optical system 101 is composed of an electron gun 1, an electron beam extraction electrode 2, a condenser lens 3, a scanning deflector 5, an aperture 6, a shield pipe 7, an EXB deflector 8, an objective lens 9, an earth electrode 15, and a shield electrode 16.

The workpiece chamber 102 is composed of an X-Y stage 11, a rotating stage 12, an optical height measuring device 26, and a length measuring device 27 for monitoring a position to be irradiated. A secondary electron detector 13 is located under the objective lens 9, and an output signal from the secondary electron detector 13 is amplified by a preamplifier 21 and is then processed into digital data by an AD convertor 22.

The image processing unit 104 is composed of an image storing units 30a and 30b, a computing unit 33, and a defect decision unit 34. The electron beam image and optical image incorporated in the image processing unit 104 are displayed on a monitor 32.

An operational command and operation condition for each unit of the circuit pattern inspecting apparatus are inputted/outputted in/from the control unit 103. Various conditions upon generation of the electron beam, such as an acceleration voltage, deflection width of an electron beam, deflection speed, moving speed of a workpiece stage, and signal incorporation timing of the detector, are previously inputted in the control unit 103.

A correction signal is created from signals supplied from the optical height measuring device 26 and length measuring device 27 for monitoring a position to be irradiated. Such a correction signal is fed to a power supply 25 for the objective lens 9 and a scanning signal generator 24 via a correction control circuit 28 in order that an electron beam 210 is usually impinged on a correct position.

The electron gun 1 employs a thermal field emission electron source of a diffusion supply type, which allows creation of images less variation in brightness to be comparatively inspected and which allows high speed inspection because the gun can increase an electron beam current.

The electron beam 201 is extracted from the electron gun 1 by applying a voltage to the extraction electrode 2. The acceleration of the electron beam 201 is performed by applying a high negative voltage to the electron gun 1. The electron beam 201 with an energy equivalent to the potential applied thereto, for example, 12 keV in this embodiment advances toward the workpiece stage 11, and is converged through the condenser lens 3 and further finely restricted through the objective lens 9, to be thus impinged on a substrate 10 to be inspected (for example, wafer or chip) mounted on the X-Y stage 11.

A negative voltage, that is, a retarding voltage can be applied from a high voltage power source 23 to the substrate 10. The earth electrode 15 is provided between the substrate 10 and the EXB deflector 8 to form an electric field caused by retarding voltage between the earth electrode 15 and the substrate 10. It is easy to adjust an electron beam energy to be emitted to the substrate 10 at the optimum value by controlling the high voltage power source 23 connected to the substrate 10.

In this embodiment, a negative potential of −11.5 kV as the retarding voltage is applied to the substrate 10. The formation of an image is performed in accordance with either a method of two-dimensionally scanning the electron beam 201 while allowing the X-Y stage 11 to remain at rest or a method of one-dimensionally scanning the electron beam 201 and continuously moving the X-Y stage 11 in the direction substantially perpendicular to the scanning direction.

In the case of inspecting only a specific location of the substrate 10, the inspection can be efficiently performed in accordance with the former method in which the stage 11 remains at rest, while in the case of inspecting a wide region of the substrate 10, the inspection can be efficiently performed in accordance with the latter method in which the stage 11 is continuously moved.

A surface image of the substrate 10 is acquired by irradiating the substrate 10 with the finely restricted electron beam 201 to produce secondary electrons 202, and detecting the secondary electrons 202 in synchronization with the scanning of the electron beam 201 and the movement of the stage 11.

The automatic inspection performed in this embodiment is essential to make fast the inspecting speed, and accordingly, such automatic inspection does not adopt the scanning at a low speed with a beam current of the pA order or the scanning repeated by a plurality of times, which scanning has been adopted in a usual SEM. That is to say, in the automatic inspection performed in this embodiment, an image is formed by only one scanning of a large current electron beam being equal to or more than about 100 times that used for the usual SEM, for example, 100 nA.

A unit image for 1000×1000 pixels is acquired as a first image at a rate of 10 msec, and the second image is acquired on the basis of an image signal which is delayed for a time equivalent to one image. That is to say, the second image is incorporated in synchronization with the first image. Both the images are then comparatively evaluated to thus search a defect on the substrate 10.

Figure 2:
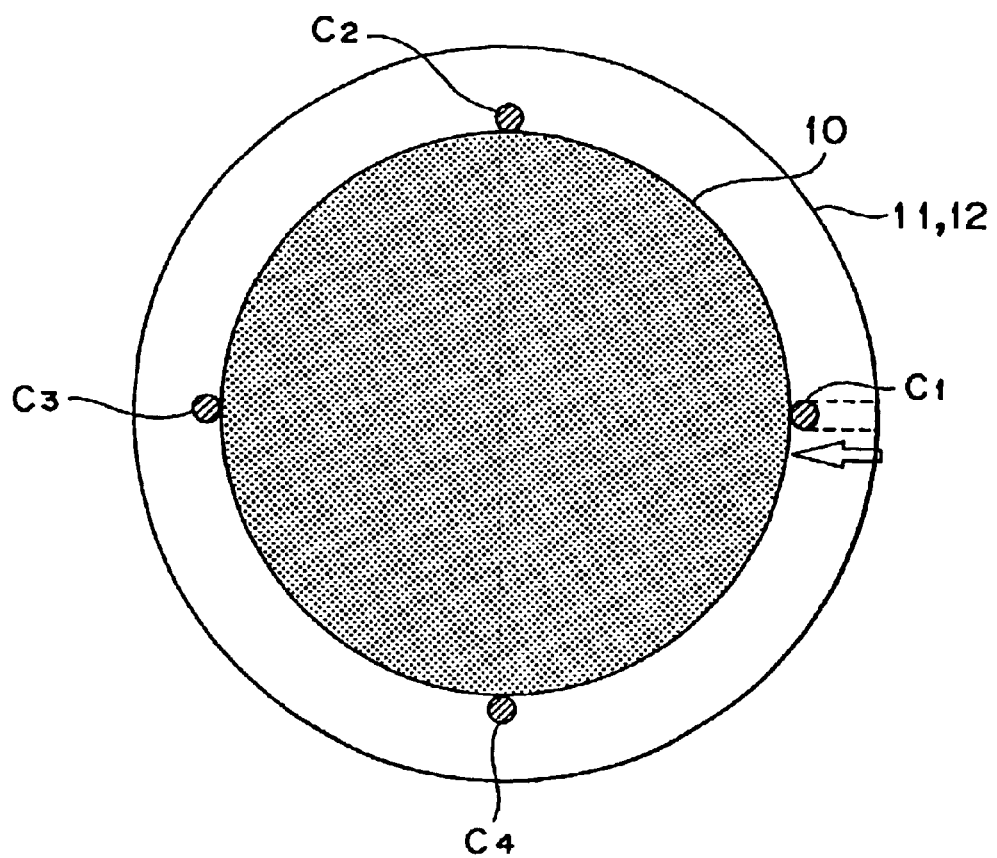
FIG. 2 is a plan view showing a state in which a substrate to be inspected is mounted in the circuit pattern inspecting apparatus.
Figure 3A:
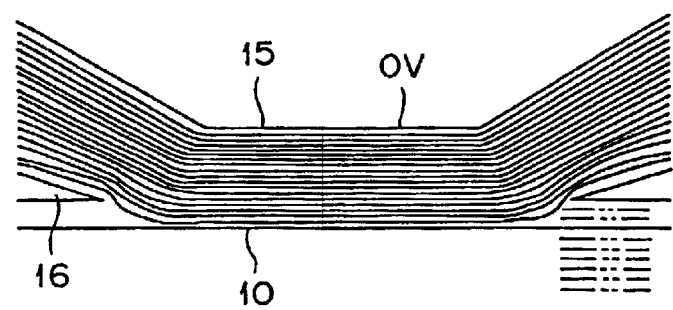
FIGS. 3A and 3B are electric field distribution diagrams each showing the result of simulation of an inner electric field.
Figure 3B:
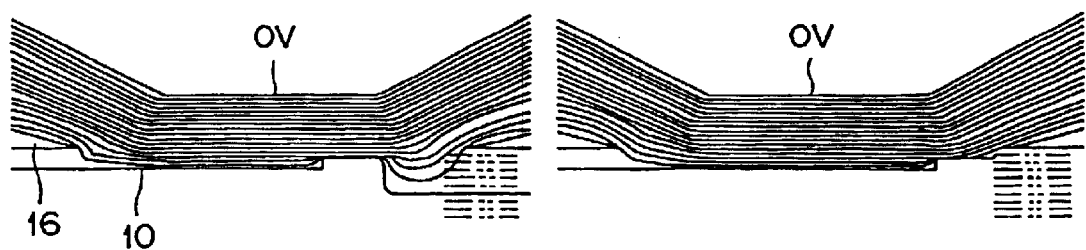

FIG. 2 is a plan view showing a state in which the substrate is mounted on the circuit pattern inspecting apparatus, and FIGS. 3A and 3B are electric field distribution diagrams each showing the result of simulation of an inner electric field of the circuit pattern inspecting apparatus. The substrate 10 is mounted on the workpiece stage 11. When a retarding voltage is applied to the substrate 10 mounted as shown in FIG. 2, there occurs an electric field caused by retarding voltage along the shape of the substrate 10 as shown in FIGS. 3A and 3B.

Referring to FIG. 2, four projections $C_1$, $C_2$, $C_3$ and $C_4$ are provided on the workpiece stage 11 in such a manner as to surround the periphery of the substrate 10, wherein one projection $C_1$ of these projections is configured to be movable via a spring. The surface of the substrate 10 is regarded as flattened in the macroscopic view, and as shown in FIG. 3A, when the central portion of the substrate 10 is observed, it may have an electric field distribution with no disturbance.

Figure 4:
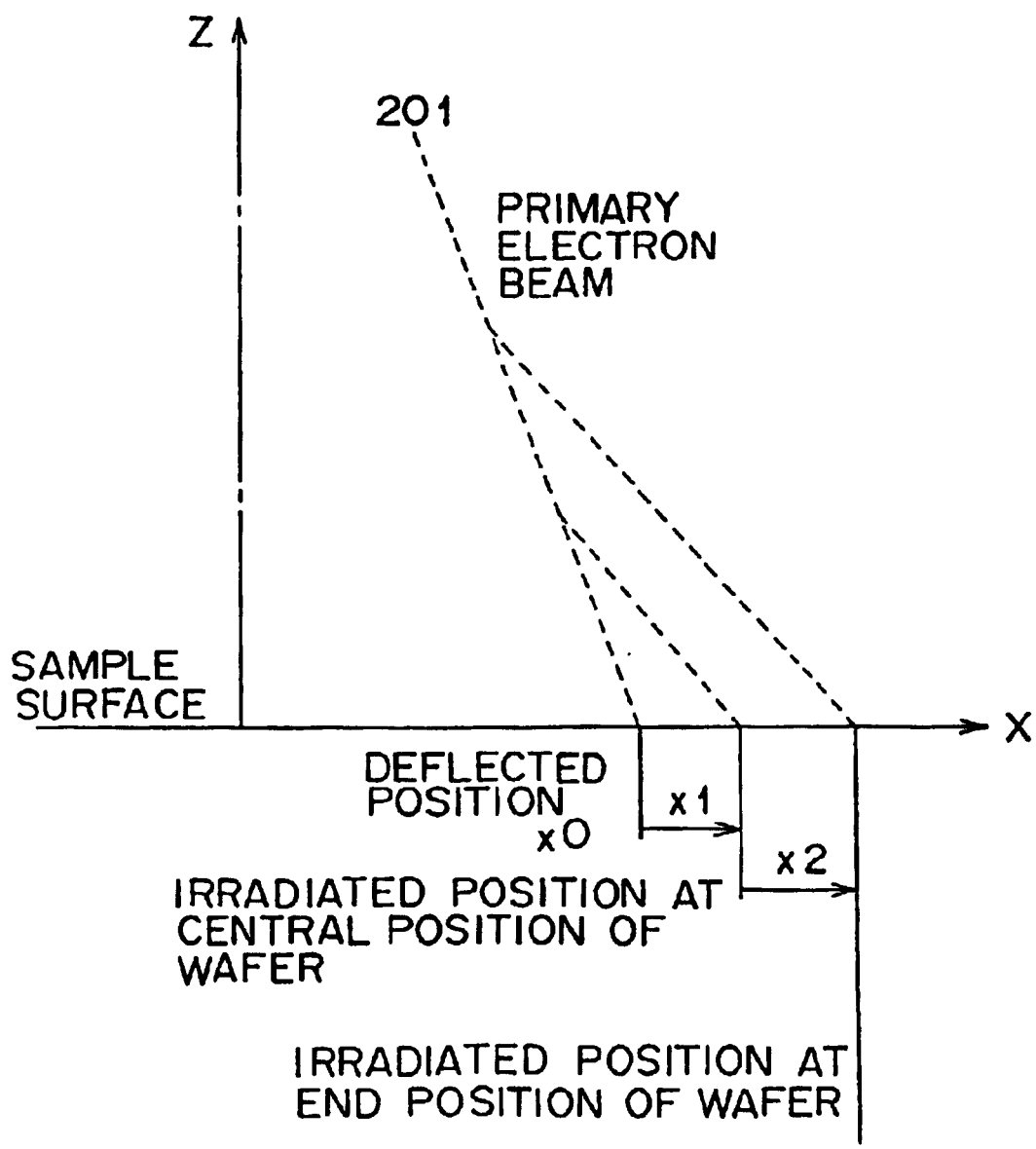
FIG. 4 is a typical diagram illustrating an electron trajectory.
Figure 5:
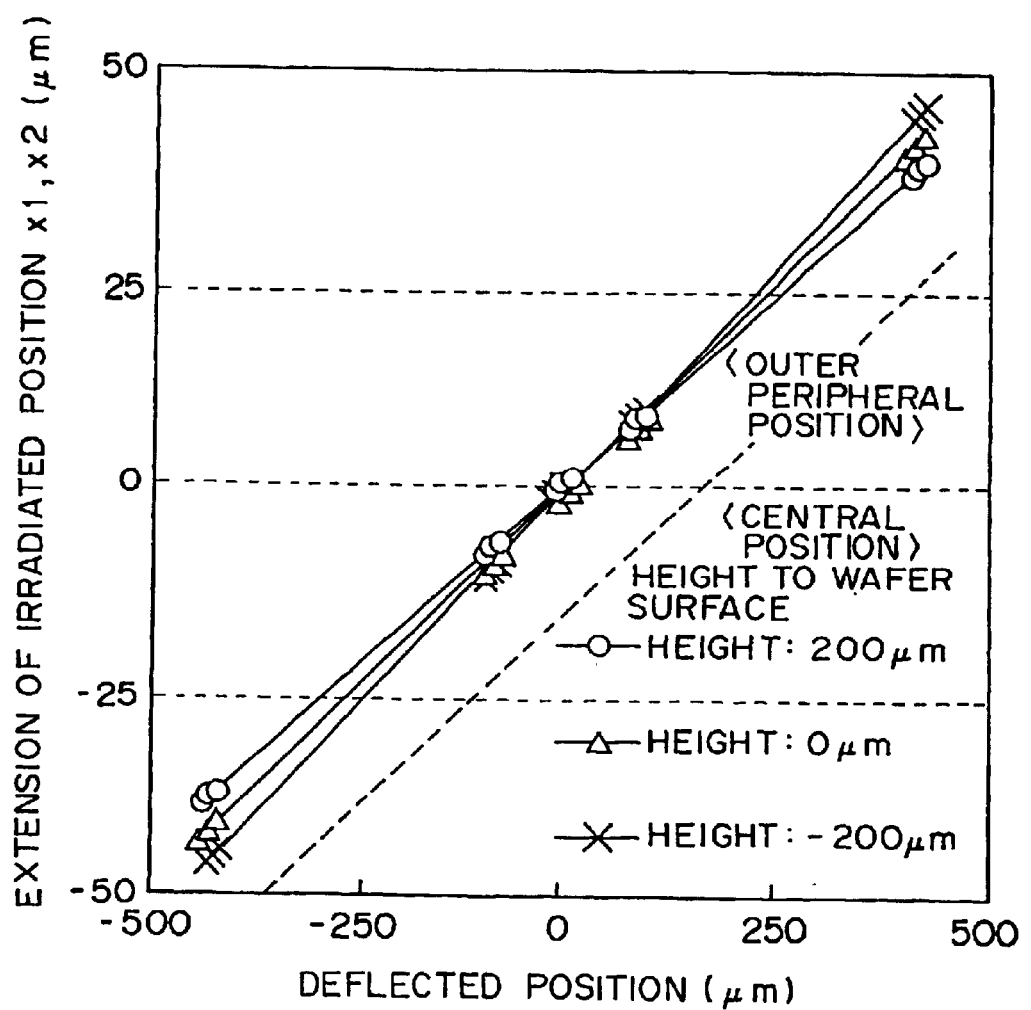
FIG. 5 is a graph showing a relationship between extension of an irradiated position with an electron and a target deflected position.

On the contrary, at the outer peripheral portion of the substrate 10, as shown in FIG. 2, the sectional shape of the substrate 10 itself is uneven and also the projections $C_1$, $C_2$, $C_3$ and $C_4$ functioning as substrate pressers are provided, and accordingly, as shown in FIG. 3B, an electric field is disturbed around the projections $C_1$, $C_2$, $C_3$ and $C_4$. Here, by the effect of the shield electrode 16 provided between the workpiece 10 and the earth electrode 15, the disturbance of an electric field caused by retarding voltage is reduced. The beam 201 is affected by such an electric field distribution as follows:

FIG. 4 is a diagram illustrating the trajectory of the primary electron beam 201, and FIG. 5 is a graph showing a relationship between the extension of an actual irradiated position with the primary electron beam 201 and a target deflected position. As shown in FIG. 4, the primary electron beam 201 is not impinged on the workpiece 10 along a linear trajectory from an intersection between a beam axis and a deflected beam, so-called deflection fulcrum (not shown) but it is retarded from a high acceleration state as nearing the vicinity of the workpiece 10 and is impinged on the workpiece 10 while being very slightly extended from the linear trajectory by the effect of the axisymmetric deflection action of the electric field caused by the retarding voltage. In the case where the beam 201 is impinged on the central portion of the substrate 10, assuming that the surface of the substrate 10 is substantially flattened in a macroscopic view, it is sufficient for only the above axisymmetric extension to be taken into account.

Referring to FIG. 4, in the case of irradiation of the central portion of the substrate 10, the primary electron beam 201 reaches an irradiated position x1 linearly shifted from a predetermined irradiated position x0 on the basis of a deflection signal. The irradiated position x1 becomes a value corresponding to the surface height of the workpiece 10 as shown in FIG. 5.

On the contrary, in the case of irradiation of the outer peripheral portion of the substrate 10, the beam 201 is further deflected by the disturbance of the neighborhood electric field caused along the sectional shape of the substrate 10. As shown in FIG. 5, upon observation of the outer peripheral portion, the beam 201 reaches an irradiated position x2 which is shifted from the irradiated position x1 substantially in parallel to one direction on the substrate 10. The shifted amount (x2–x1) is equivalent to a beam distortion amount, which is dependent on the sectional shape of the portion, in the vicinity of the irradiated position, of the substrate 10.

As a result of examination, it becomes apparent that the shifted amount (x2–x1) can account for about several tens % of the deflection width of the beam, and that the beam distortion amount (x2–x1) is, strictly speaking, not linearly changed from the predetermined irradiated position. The fact that the beam distortion amount at the outer peripheral portion of the substrate is the non-linear and non-negligible amount causes the following two problems:

One problem is that both the correction upon observation of the outer peripheral portion and the correction upon observation of the central portion cannot be performed using the same correction table. Another problem is that if a standard mark sample for preparing a deflection correction table is provided at the outer peripheral portion of the workpiece stage 11, the prepared correction table itself contains the distortion amount of the primary electron beam 201, with a result that the deflection cannot be suitably corrected using such a deflection correction table.

Additionally, in this circuit pattern inspecting apparatus which is aimed at automatically, relatively inspecting images at a high speed, it is required to prepare a deflection correction table for a short period of time while keeping up with the beam drift due to a change in the electro-optical system 101 with the elapsed time.

To be more specific, the circuit pattern inspecting apparatus according to the present invention is adapted to relatively inspect images while correcting deflection of an electron beam in accordance with a procedure shown in FIG. 6. FIG. 6 is a flow chart illustrating the operational procedure for the circuit pattern inspecting apparatus, in which the plan view of a substrate to be inspected is additionally shown. First, a basic calibration flow is executed upon periodical maintenance of the circuit pattern apparatus.

A calibrating wafer in which a sample with standard marks formed on two surfaces different in thickness (+200 $\mu$m, –200 $\mu$m) is buried is loaded on the central portion of the workpiece stage 11, and images at the surface heights zH and zL of the central standard marks are acquired. The image signals thus obtained are stored in a central standard mark signal storing unit 35. The range of each of the surface heights zH and zL of the standard marks is set at a value nearly equal to a variation range of the surface height of the substrate 10 caused by warping of the substrate 10. Next, a sample 17 with standard marks formed on two surfaces different in thickness is similarly provided at the outermost peripheral portion of the workpiece stage, and images therefrom are acquired and stored in an outer peripheral standard mark signal storing unit 36.

Figure 7:
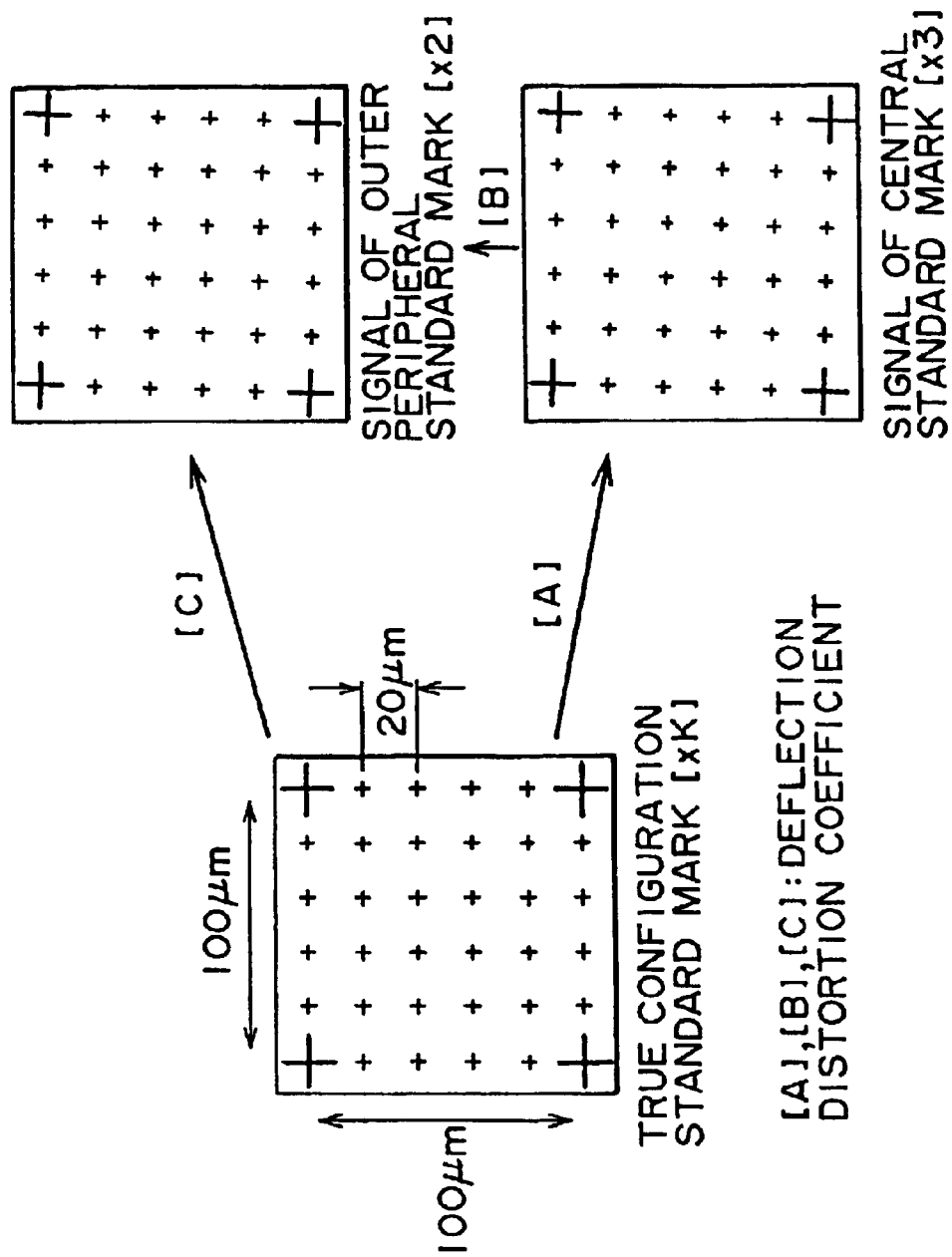
FIG. 7 is a typical diagram showing one example of image display.

The standard mark image signals thus obtained in accordance with the present invention are shown in FIG. 7. FIG. 7 is a typical diagram showing one example of image indication.

As shown in FIG. 7, a true configuration of the standard mark [xk], a central standard mark signal [x3] and an outer peripheral standard mark signal [x2] form different mark images, respectively. The signals read from the storing unit 35 in which the central standard mark signal [x3] is stored and from the storing unit 36 in which the outer peripheral standard mark signal [x2] is stored are converted into a distortion coefficient [B] by a comparing unit 37. That is to say, an outer peripheral distortion coefficient B is calculated from a positional deviation between the central and outer peripheral standard mark signals and is stored in an outer peripheral distortion amount storing unit 38.

The outer peripheral distortion coefficient B is defined by the following equations (1) and (2).

$$[x2(zH)]=[B(zH)][x3(zH)] \tag{1}$$

$$[x2(zL)]=[B(zL)][x3(zL)] \tag{2}$$

While the outer peripheral distortion amount B upon periodical maintenance is stored, the next calibration flow based on the outer peripheral standard marks is carried out for each wafer. Like the basic calibration, images of a sample with standard marks formed on two surfaces having heights zH and zL provided at the outermost peripheral portion of the workpiece stage are formed. The absolute value of the difference between zH and zL, (|zH–zL|) is set at 400 $\mu$m.

The positional signals of the outer peripheral standard marks [x2(zH)] and [x2(zL)] are stored in the storing unit 36. An outer peripheral deflection distortion coefficient C is calculated by comparing the outer peripheral standard mark signal [x2] with the true position xk of the standard mark using a computing circuit 39 for removing the outer peripheral distortion amount.

The outer peripheral deflection distortion coefficient C is defined by the following two equations (3) and (4):

$$[x2(zH)] = [C(zH)][xk] \tag{3}$$
$$= ([A(zH)] + [B(zH)])[xk]$$

$$[x2(zL)] = [C(zL)][xk] \tag{4}$$
$$= ([A(zL)] + [B(zL)])[xk]$$

The above distortion amount contains a distortion amount inherent to the outer peripheral portion because the standard mark is positioned at the outermost peripheral portion of the workpiece stage.

The distortion amount [B] caused only at the outer peripheral portion, which is obtained by the difference between the outer peripheral standard mark signal and the central standard mark signal on the basis of the above equations (1) and (2), is substituted in the above equations (3) and (4), to eliminate the outer peripheral distortion coefficient [B], thereby obtaining a deflection distortion coefficient [A] equivalent to the central distortion amount.

The deflection distortion coefficient [A] is defined by the following equations (5) and (6):

$$[A(zH)]=[C(zH)]-[B(zH)] \tag{5}$$

$$[A(zL)]=[C(zL)]-[B(zL)] \tag{6}$$

The deflection distortion coefficient [A] has been obtained from a specific height, that is, each of the standard marks formed on the two surfaces of the workpiece, and accordingly, a specific deflection correcting table can be calculated on the basis of the deflection distortion coefficient [A], and further a general deflection correcting table for an arbitrary height can be calculated by a storing unit 40.

Assuming that the height dependency of the general deflection correcting table is linear, the general deflection correcting table can be obtained for each height using a so-called interpolation method.

$$[A(z)]=([A(zH)]-[A(zL)])\times(z-zL)/[(zH-zL)+[A(zL)]]$$

In this way, by the above two-stage calibration of the deflection correcting table, the highly accurate deflection correcting table not affected by the beam distortion can be updated without frequently performing the basic calibration flow requiring replacement of the substrate 10 and taking a long period of time.

After the deflection correcting table is accomplished by the calibration flow described above and is stored, the usual inspection begins.

First, a region to be inspected of the substrate 10 is successively measured by the workpiece height measuring device 26, and height signals are fed to a deflection correcting signal generating circuit 29. The circuit 29 creates a deflection correcting signal while referring to the deflection correcting table. The beam 201 is deflected on the basis of the deflection correcting signal, to take out an image signal. The image signals thus taken out are processed by a delay circuit 31 such that the first image signal is delayed from the second one for a time equivalent to one image, and are compared with each other by the computing unit 33. The presence or absence of a defect is decided by the defect decision unit 34 on the basis of the compared result. In this embodiment, to allow the deflection correcting table to highly accurately keep up with the drift of the beam 201 caused by a change in the electro-optical system 101 with the elapsed time, the observation of the image of outer peripheral standard mark 17 and the update of the deflection correcting table are carried out at one timing for each wafer by an update control unit 41 for updating the deflection correcting table.

A new outer peripheral mark signal and the existing outer peripheral distortion amount are computed, and a deflection correcting table is updated by eliminating the distortion amount. The updating timing of the deflection correcting table can be previously set in the update control means 41.

Further, in this embodiment, as shown in FIG. 6, a region of the substrate 10 narrower than the outer periphery by a width of 10 mm is decided as a region in which deflection cannot be corrected using the same deflection correcting table, that is, as an inspection disable area by an inspection unavailable region control means 42. That is to say, the decision for such a region is regarded as unavailable by the defect decision unit 34, and such a region is not irradiated with the electron beam 201.

The reason for this is that since the workpiece stage 11 has the anisotropic configuration in which the beam distortion is uneven, the correction in consideration of the dependence of the position of the substrate on the correcting table becomes very complicated and takes a lot of time.

The width of the sample with the outer peripheral standard marks is set at 10 mm in consideration of a range in which the beam can be corrected using the same deflection correcting table, and an image is acquired at the center of the sample surface at each height of the standard mark. The sample with the central standard marks is configured to be larger in its area than the sample with the outer peripheral standard marks, and the image formation of each central standard mark is performed at a position separated 10 mm or more than the boundary between the two-surfaces of the standard marks.

According to this embodiment, it is possible to reduce the misdetection ratio by 20% as compared with the case in which the inspection is performed by correcting deflection not in consideration of the beam distortion using the same electro-optical system.

In the above embodiment, description is made using the electron source and electron beam are used; however, in the case of using a charged particle source and charged particle beam, the same configuration as that of the above electro-optical system is called an irradiation optical system.

[Second Embodiment]

A circuit pattern inspecting apparatus according to another embodiment of the present invention will be described with reference to FIG. 8.

Figure 8:
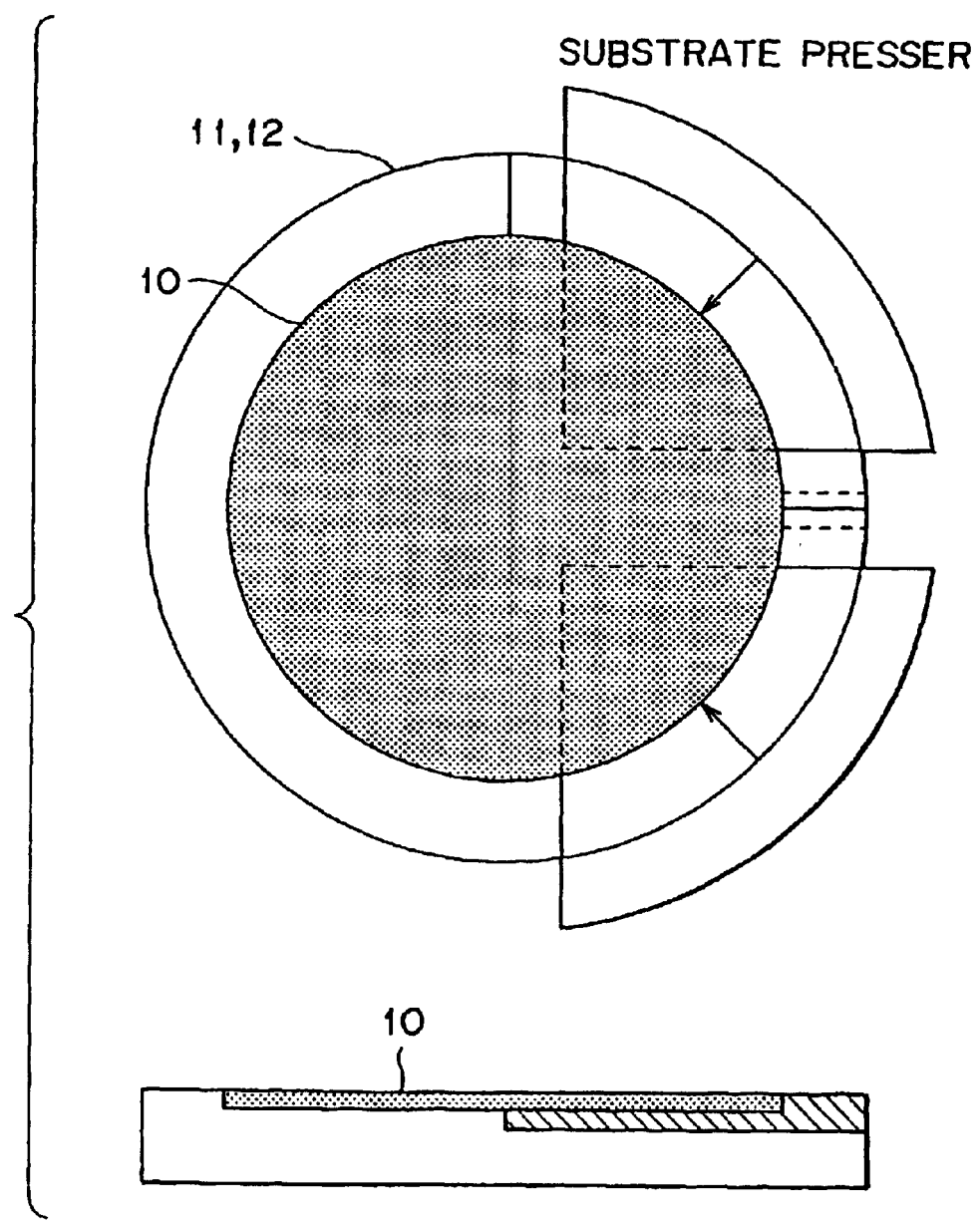
FIG. 8 is a plan view showing a state in which a substrate to be inspected is mounted on a workpiece stage.
Figure 9:
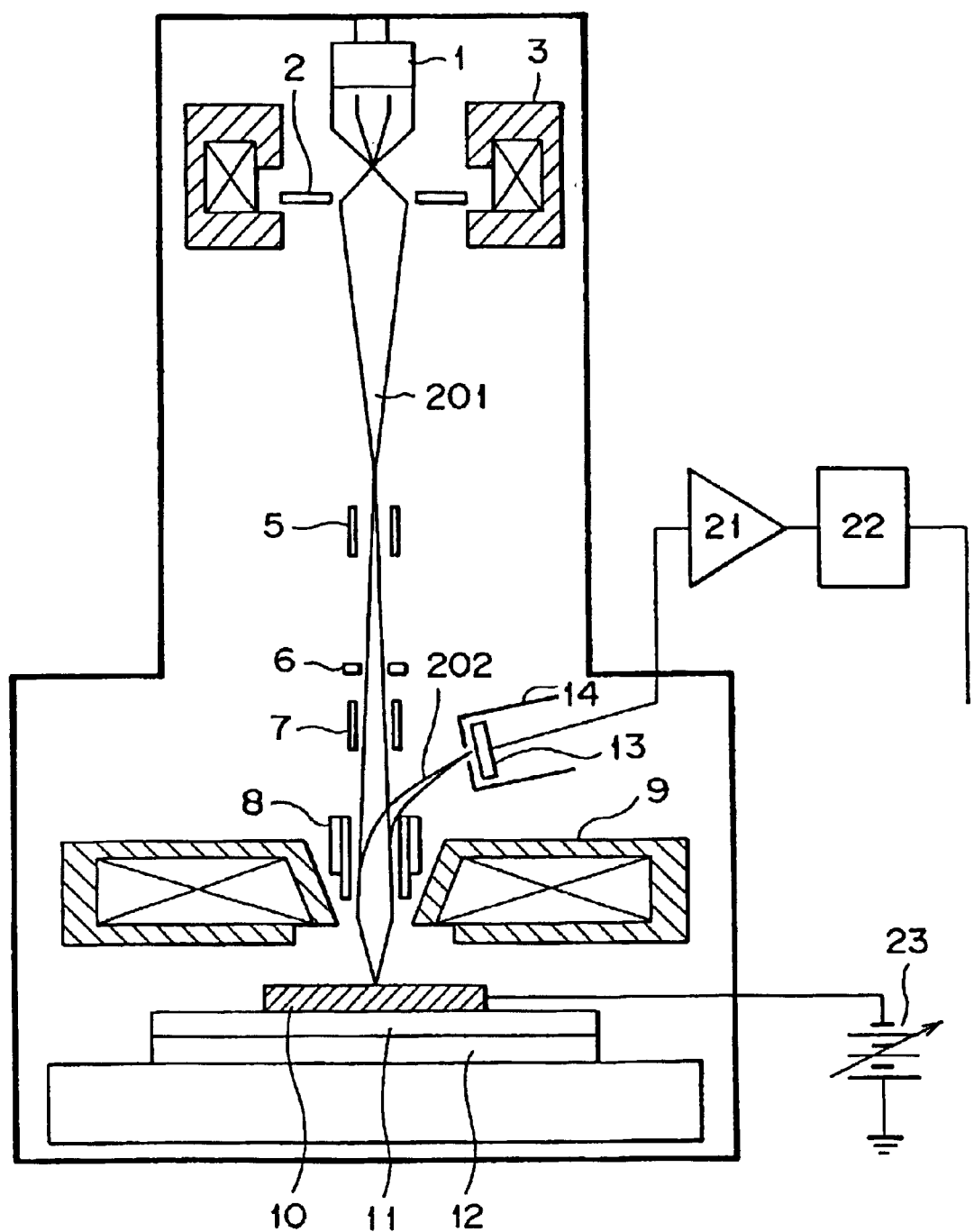
FIG. 9 is a vertical sectional view showing the configuration of a prior art circuit pattern inspecting apparatus.

FIG. 8 is a plan view, similar to FIG. 2, showing a state in which a substrate to be inspected is mounted on a workpiece stage. This embodiment is different from the first embodiment in that a workpiece stage 11 having an isotropic configuration is used, and accordingly, this embodiment will be described only with reference to the partial configuration view of FIG. 8. The workpiece stage 11 of an electrostatic chuck type is 100 $\mu$m or less higher than the surface of a substrate 10 as the workpiece and wider 10 mm than the outer periphery of the substrate 10 in the moving direction.

A portion, having a center angle of 180° or more, of the workpiece stage 11 located around the substrate 10 is movable, and after the substrate is mounted on the workpiece stage 11, the movable portion of the workpiece 11 is moved in proximity to the substrate 10 and fixed at a position in contact with the outer periphery of the substrate 10. This configuration is complicated and is hard in actual operation, but is advantageous in that the beam distortion caused at an end portion of the substrate 10 is reduced, thereby making it possible to inspect the nearly entire surface of the substrate 10, for example, a range having an outer limit positioned 3 mm inwardly from the outer periphery of the substrate 10. In this embodiment, it is not required to generate an unavailable signal from the inspection unavailable region control means 42.

[Third Embodiment]

A further embodiment of the present invention will be described below. In this embodiment, while not shown, the inside diameter of the shield electrode 16 is reduced to half, that is, changed from 30 mmΦ to 15 mmΦ. As a result, the disturbance of an electric field caused by a retarding voltage is reduced. This makes it possible to inspect a range having an outer limit positioned 7 mm inwardly from the outer periphery of the substrate 10.

As described above, according to the present invention, there can be obtained the circuit pattern inspecting apparatus or circuit pattern inspecting method of previously taking into account the disturbance of an electric field caused in the vicinity of the outer peripheral portion of the substrate 10 as the workpiece to which a high negative retarding voltage is applied, thereby highly accurately correcting the deflection of the primary electron beam 201 in such a manner as to be matched with the height of an irradiated position of the substrate 10 with the electron beam 201 without receiving adverse effect of the distortion of the beam 201 at the outer peripheral portion of the substrate 10. In the above apparatus or method, the deflection correcting table is prepared on the basis of the outer peripheral standard marks 17; however, there may be adopted another configuration in which the diameter of the workpiece stage 11 is made sufficiently larger than the size of the wafer and the standard marks 17 are provided inwardly from the outer periphery of the workpiece stage 11 sufficiently to prevent occurrence of the beam distortion.

The effect of the disturbance of an electric field is varied by changing a retarding voltage and thereby the inspection effective region is varied. In consideration of such a change, the inspection unavailable region control means 42 is provided. This enables inspection with less wastage. In addition, the numeral values described in the above embodiments are for illustrative purposes only, and it is to be understood that the present invention may be of course carried out under different specifications. For example, the circuit pattern can be more efficiently, highly accurately inspected by optimizing the width and height of each of the substrate pressing projection of the workpiece stage and substrate drop hole, and the thickness and size of the workpiece with the standard marks in consideration of the conditions such as the size and thickness of the substrate, a variation range of the surface height of the substrate due to warping, and a retarding voltage.

As described above, according to the present invention, even if a highly retarding voltage is applied to a substrate as a workpiece, the deflection of the primary electron beam can be highly fast, highly accurately corrected in such a manner as to be matched with the height of the workpiece without receiving adverse effect of the beam distortion caused at the outer peripheral portion of the substrate. As a result, with respect to a circuit pattern at the step of fabricating a semiconductor device including an insulating material or a mixture of an insulating material and a conductive material, it is possible to highly fast, stably acquire highly accurate images from desired positions of the circuit pattern by irradiating the positions with an electron beam, without occurrence of any deviation between the irradiated positions, and automatically comparing the images with each other, thereby inspecting defects of the circuit pattern without occurrence of errors.

[Fourth Embodiment]

A further embodiment of the present invention will be described below.

Figure 10:
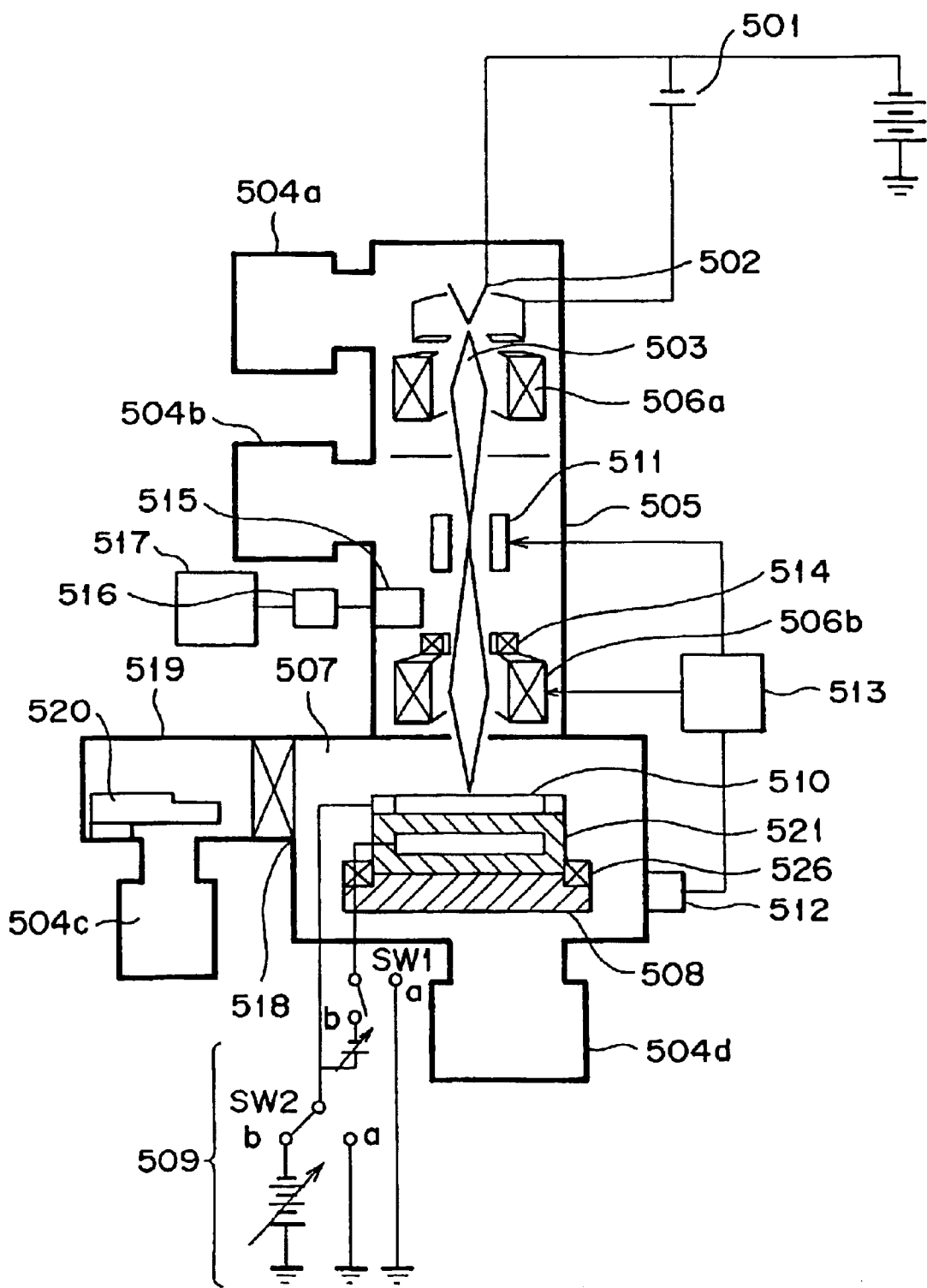
FIG. 10 is a vertical sectional view of essential components of a semiconductor inspecting apparatus using an electron beam.

As one example of an electron beam application apparatus, a semiconductor inspecting apparatus using an electron beam will be described. FIG. 10 is a vertical sectional view showing main parts of the semiconductor inspecting apparatus using an electron beam. The semiconductor inspecting apparatus inspects whether or not a semiconductor wafer or a circuit pattern formed on a circuit pattern mask for transferring the circuit pattern on the wafer is desirably prepared. Accordingly, in the semiconductor inspecting apparatus, a wafer or mask is taken as a workpiece.

Referring to FIG. 10, an electro-optical system of the semiconductor inspecting apparatus includes an electron gun 502 for emitting electrons with electric power supplied from a power source 501; an electron beam 503 extracted from the electron gun 502; a condenser lens 506a and an objective lens 506b for converging the electron beam 503 so as to irradiate a wafer 510 as the workpiece with the electron beam 503; a deflector 511 for deflecting the electron beam 503 so as to irradiate a desired position of the wafer 510 with the electron beams 503; and a mirror body 505 containing a secondary electron detector 515 for detecting secondary electrons produced from the wafer 510 by irradiation of the wafer 510 with the electron beam 503 and a Wien filter 514 for changing the direction of the secondary electrons toward the secondary electron detector 515. The values of currents applied to the deflector 511 and objective lens 506b are controlled by a control unit 513.

The wafer 510 is carried from a load lock chamber 519 into a workpiece chamber 507 and mounted on a workpiece holder 521 in the workpiece chamber 507 by a carrying unit 520. The position of the workpiece holder 521 is fixed by pallet guides 526 of a movable stage 508. The mirror body 505 and workpiece chamber 507 are evacuated via exhaust units 504a and 504b and exhaust units 504c and 504d, respectively. A gate valve 518 is provided between the load lock chamber 519 and workpiece chamber 507, which gate valve 518 is opened only when the wafer 510 is carried in the workpiece chamber 507.

Since the scanning range of the electron beam 503 by the deflector 511 is narrower than the size of the wafer 510, the stage 508 is continuously or intermittently moved to allow a desired circuit pattern of the wafer 510 to be irradiated with the electron beam 503. At this time, the alignment of the wafer 510 is performed by measuring the position of the stage 508 using a laser interferometer 512, and correcting the position of the wafer 510 by superimposing a corrected amount representative of the position of the stage 508 on the deflected amount of the electron beam 503 by the control unit 513.

The secondary electrons produced from the wafer 510 by irradiation of the wafer 510 with the electron beam 503 are deflected toward the secondary electron detector 515 by the Wien filter 514 and are detected by the secondary electron detector 515. The detected amount of the secondary electrons is amplified by an amplifier 516, being processed by an information processing unit 517, and is outputted as an image signal from the information processing unit 517.

To improve the resolution of an image of the secondary electrons, the voltage applied to the electron beam 503 may be increased; however, depending on the kind of the workpiece, there may occur an inconvenience that the workpiece is destroyed by the energy of the high voltage electron beam 503. To cope with such an inconvenience, there is known a method of retarding the electron beam 503 just before the workpiece by applying a negative retarding voltage from a retarding power source 509 to the workpiece. This method is particularly effective for inspecting a workpiece such as a semiconductor wafer.

Figure 11:
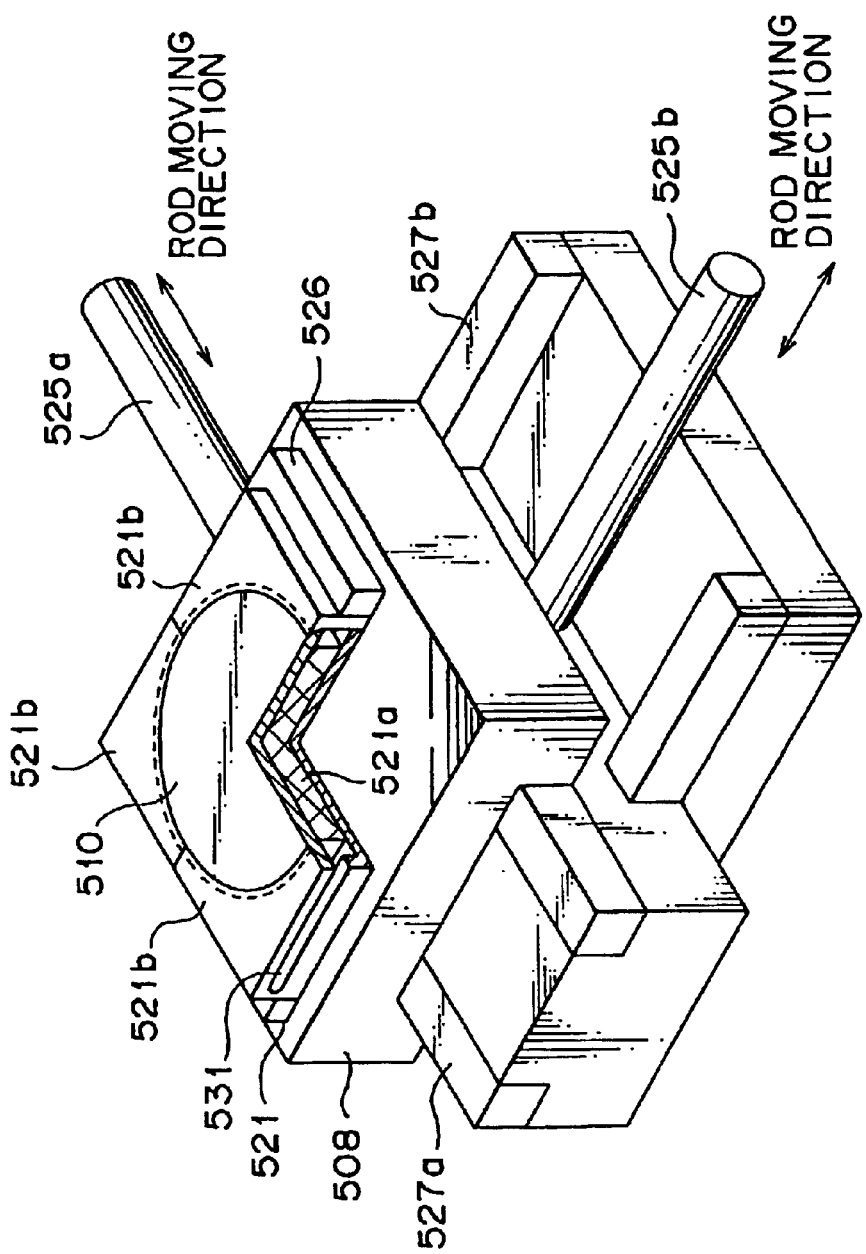
FIG. 11 is a perspective view, with parts partially cutaway, showing the configurations of a workpiece stage and a workpiece holder of a semiconductor inspecting apparatus using an electron beam.

FIG. 11 is a perspective view, with parts partially cutaway, showing the configurations of the stage 508 and workpiece holder 521.

The workpiece holder 521 is fixed on the stage 508 while being guided by the pallet guides 526. The wafer 510 is mounted on the workpiece holder 521 via an electrostatically attracting unit 521a. A holding plate 521b surrounds the wafer 510. The workpiece holder 521 is provided with a carrying port 531 through which the wafer 510 is transferred in or from the workpiece holder 521. The stage 508 is moved by drive rods 525a and 525b in the directions along linear guides 527a and 527b.

FIGS. 12A and 12B are a plan view and a vertical sectional view of the workpiece holder 521 shown in FIG. 11, respectively. FIG. 12A shows a state before the holding plate 521b located around the wafer 510 is moved, and FIG. 12B shows a state after the holding plate 521b located around the wafer 510 is moved.

Referring to FIG. 12A, the wafer 510 is carried into the workpiece holder 521 through the carrying port 531 and is mounted on the electrostatically attracting unit 521a. Then, as shown in FIG. 12B, the wafer 510 is lifted by a lifting mechanism 528 in the lifting direction 536 up to a height being nearly equal to that of the holding plate 521b, so that the surface height of the wafer 510 becomes nearly equal to that of the holding plate 521b of the workpiece holder 521. Next, the holding plate 521b divided into two or more parts is slid by a holder sliding mechanism 532 in the slide direction 535 toward the center of the wafer 510, to be brought in contact with an end portion of the wafer 510. In this embodiment, the holding plate 521b is divided into four parts.

Although it may be desirable that the surface height of the wafer 510 be perfectly equal to that of the holding plate 521b of the workpiece holder 521, it is difficult to make the surface height of the wafer 510 perfectly equal to that of the holding plate 521b from the viewpoints of machining accuracy, assembling accuracy and the like. Accordingly, it is required to set a dimensional tolerance with respect to the identification between both the surface heights of the wafer 510 and holding plate 521b, and such a dimensional tolerance has been experimentally found by the present inventors (which will be described in detail later).

Although a slight gap 537 is set between the wafer 510 and holding plate 521b in this embodiment, it may be desirable not to be present therebetween. From the viewpoint of practical use, however, the gap 537 may be formed therebetween depending on machining accuracies of the outer peripheral dimension of the wafer 510 and the dimension of the holding plate 521b. The dimensional tolerance of such a gap will be described later.

[Fifth Embodiment]

Figure 13:
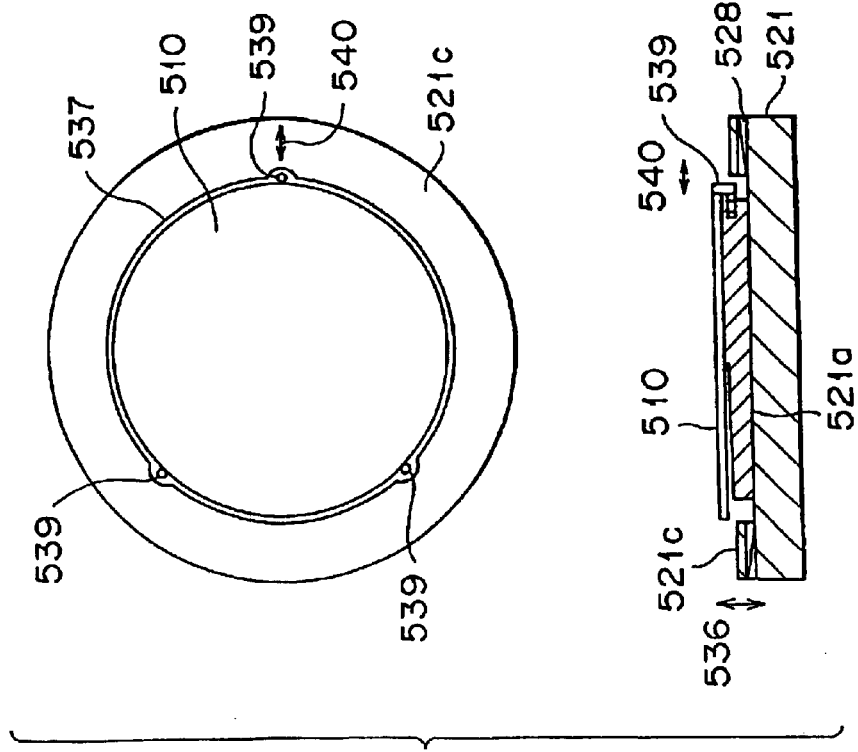
FIG. 13 is a plan view of another workpiece holder, in which the cross-section thereof is additionally shown.

FIG. 13 is a plan view of a workpiece holder 521 as a further embodiment of the present, invention, in which the vertical cross section of the workpiece holder 521 is additionally shown. A wafer 510 is mounted on an electrostatically attracting unit 521a, and one of a plurality of holding pins 539 is moved in the pin moving direction 540 to fix the position of the wafer 510. Then, a holding plate 521c is moved in the lifting direction 536, so that the surface height of the wafer 510 becomes nearly equal to that of the holding plate 521c.

Figure 14:
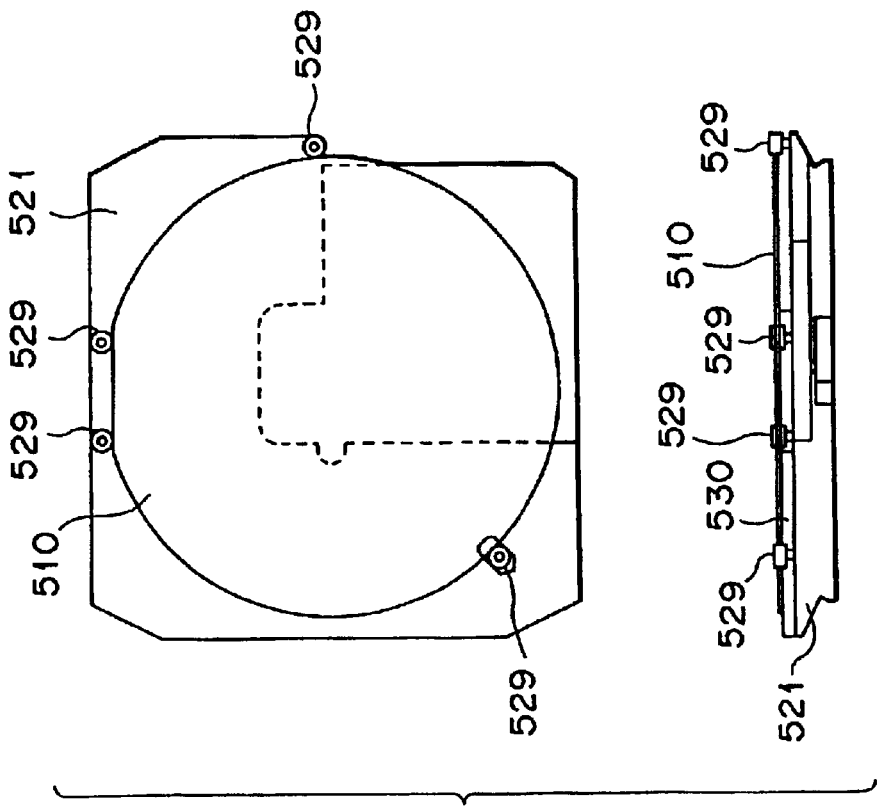
FIG. 14 is a plan view of a prior art workpiece holder, in which the side view thereof is additionally shown.

FIG. 14 and FIGS. 15A to 15C show configurations of prior art workpiece holders. FIG. 14 is a plan view of the first prior art workpiece holder, in which the side view of the workpiece holder is additionally shown.

Referring to FIG. 14, a wafer 510 is mounted on a supporting stage 530 fixed on a workpiece holder 521, and the position of the wafer 510 is fixed by a plurality of bearings 529. Accordingly, the height of the workpiece holder 521 located around an end portion of the wafer 510 is lower than that of the wafer 510 by an amount equivalent to the thickness of the wafer 510.

Figure 15A:
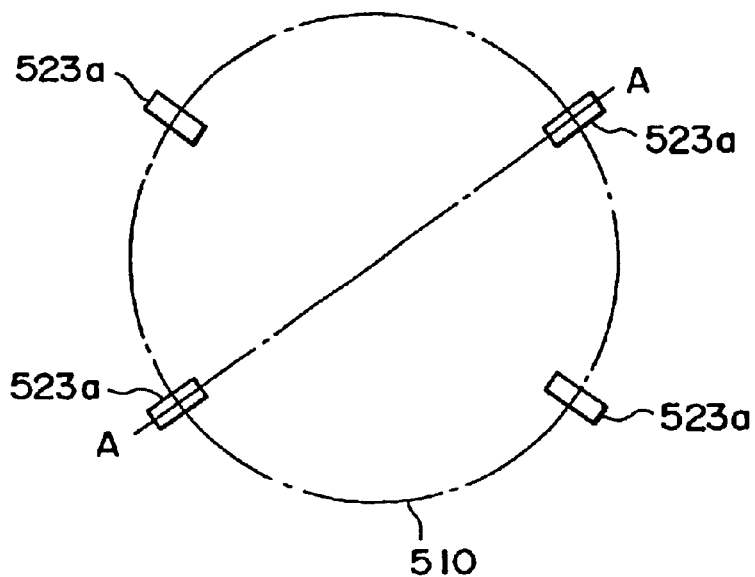
FIGS. 15A, and 15B and 15C are a plan view and sectional views showing the workpiece holding configuration of another prior art workpiece holder, respectively.
Figure 15B:
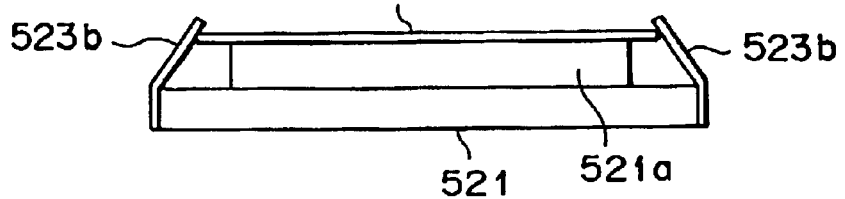
Figure 15C:
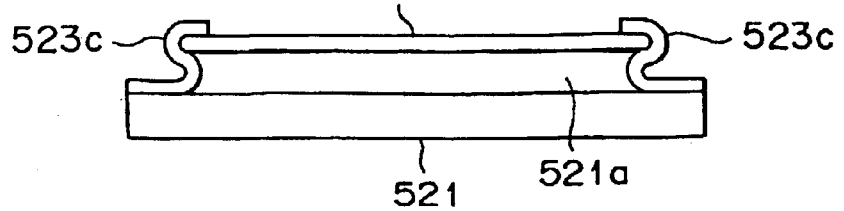

FIG. 15A, and FIGS. 15B and 15C are a plan view and sectional views of the second prior art workpiece holder, respectively. Referring to FIG. 15A, a wafer 510 is mounted on an electrostatically attracting unit 521a fixed on a workpiece holder 521, and the position of the wafer 510 is fixed by a plurality of claws 523a. The cross-section of the claw 523a for pressing the wafer 510 can be configured as that of a claw 523b shown in FIG. 15B or configured as that of a claw 523c shown in FIG. 15C. That is to say, these claws 523a (523b, 523c) project inwardly of the peripheral portion of the wafer 510. Assuming that the wafer 510 fixed on such a prior art workpiece holder is irradiated with an electron beam while a retarding voltage is applied to the wafer 510, the following simulation of an electric field distribution is made.

FIGS. 16, 17A and 17B, and 18A and 18B each show a electric field distribution diagram showing the result of simulation of an electric field distribution on the surface of the wafer 510 in the case where the wafer 510 is fixed on the workpiece holder 521 and is irradiated with an electron beam 503 while a retarding voltage is applied to the wafer 510. In the figures, a plurality of lines designate equipotential lines 524 connecting points having equal voltages to each other.

Figure 16:
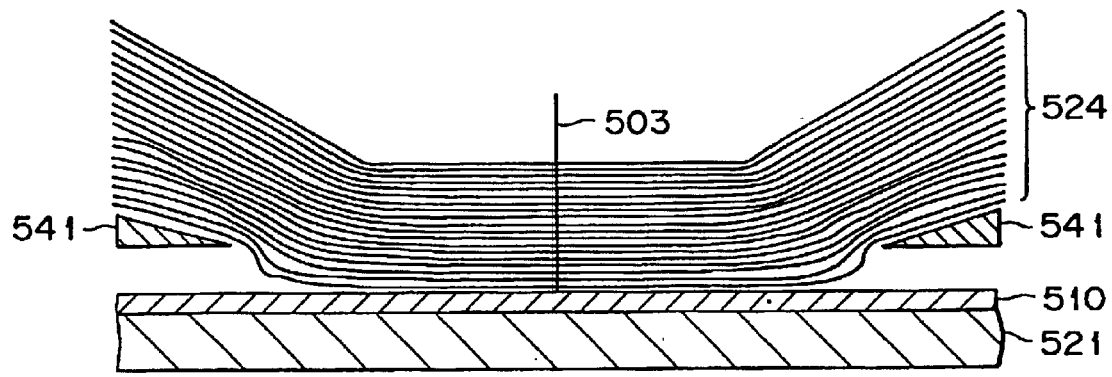
FIG. 16 is an electric field distribution diagram showing the result of simulation of an electric field distribution of a workpiece along the vertical cross-section of the workpiece surface.

FIG. 16 shows the case where a central portion of the wafer 510 is irradiated with the electron beam 503, in which the trajectory of the electron beam 503 is designated by the vertical line at the center of the figure. The equipotential lines 524 on the surface of the wafer 510 extend in parallel to the surface of the wafer 510 up to the vicinity of a shield electrode 541. In such a region, there does not occur any change such as disturbance, that is, there is no dimensional effect due to the retarding potential applied to the electron beam 503. The equipotential lines 524 are separated from the surface of the wafer 510 in the vicinity of the shield electrode 541.

Figure 17A:
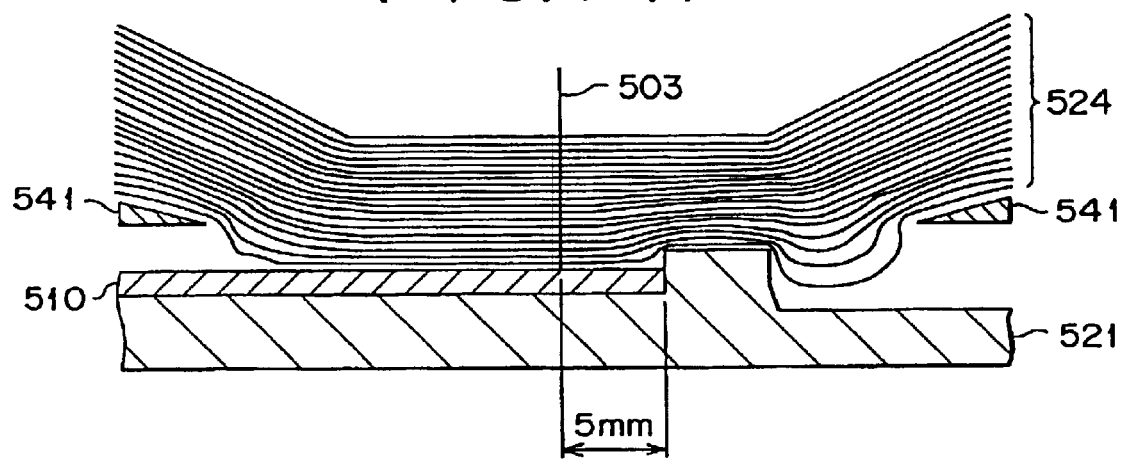
FIGS. 17A and 17B are electric field distribution diagrams each showing the result of simulation of an electric field distribution of a workpiece along the vertical cross-section of the workpiece surface.
Figure 17B:
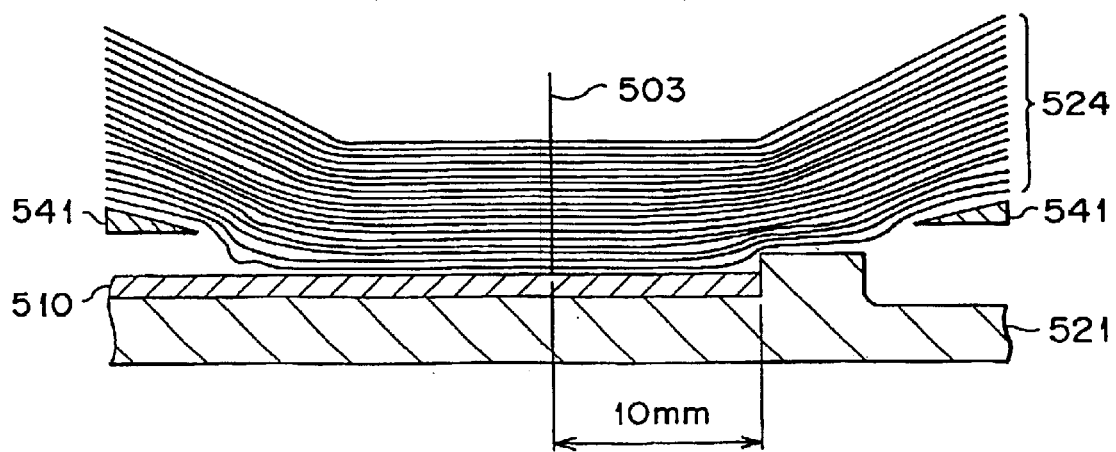

FIGS. 17A and 17B are each an electric field distribution diagram showing the result of simulation of an electric field on the surface of the wafer 510 in the case where a projection of the workpiece holder 521 is 1 mm higher than an end portion of the wafer 510; wherein FIG. 17A shows the case where an irradiated position with the electron beam 503 is 5 mm separated from the projection, and FIG. 17B shows the case where an irradiated position with the electron beam 503 is 10 mm separated from the projection.

From the comparison between the results shown in FIGS. 17A and 17B, it is apparent that a variation in electric field in FIG. 17A is larger than that in FIG. 17B, that is, the variation in electric field becomes larger as the projection becomes closer to the irradiated position with the electron beam 503. To be more specific, in a range, apart 5 mm from the projection, of the wafer 510, there is a high possibility that the electric field is varied to disturb the irradiated position with the electron beam 503.

Figure 18A:
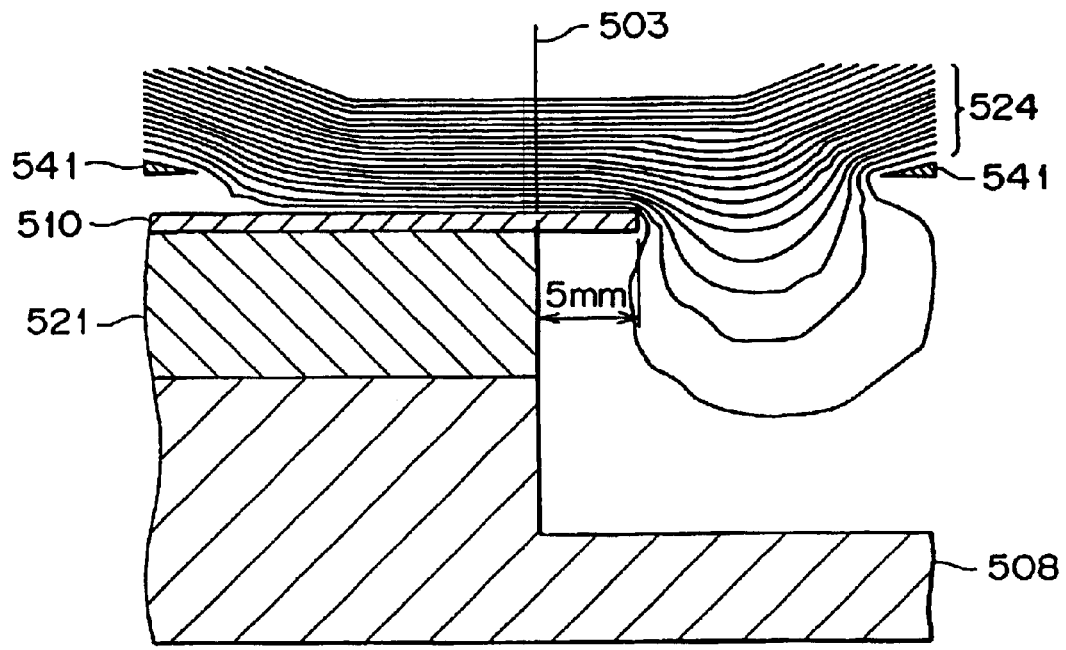
FIGS. 18A and 18B are electric field distribution diagrams each showing the result of simulation of an electric field distribution of a workpiece along the vertical cross-section of the workpiece surface.
Figure 18B:
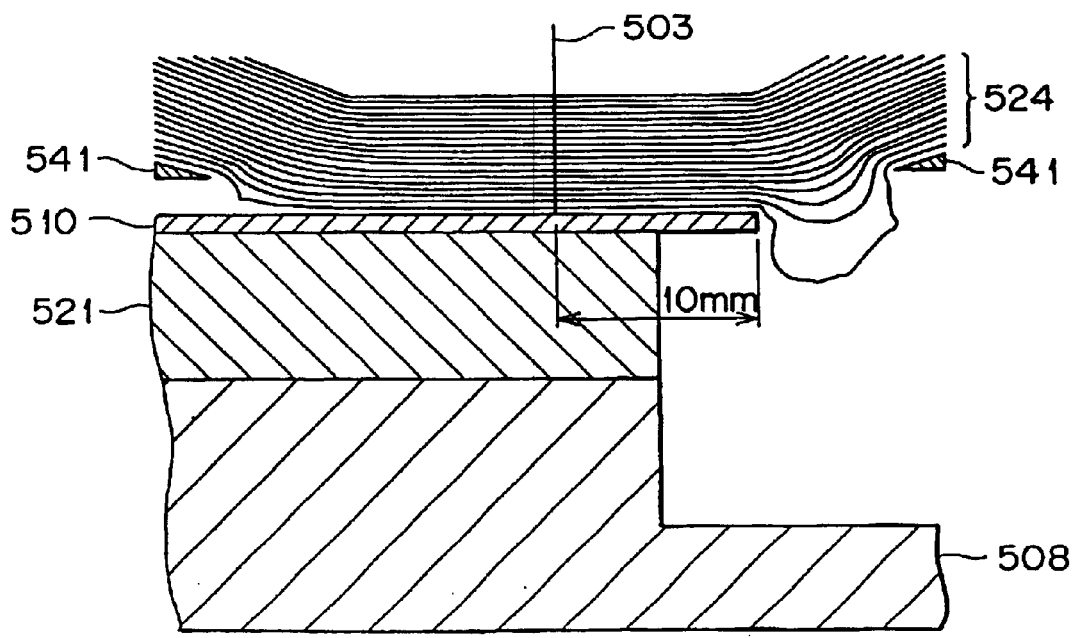

FIGS. 18A and 18B are each an electric field distribution diagram showing the result of simulation of an electric field on the surface of the wafer 510 in the case where an end portion of the wafer 510 projects from the workpiece holder 521 to form a space under the end portion of the wafer 510; wherein FIG. 18A shows the case where an irradiated position with the electron beam 503 is 5 mm separated from the end portion of the wafer 510; and FIG. 18B shows the case where an irradiated position with the electron beam 503 is 10 mm separated from the end portion of the wafer 510.

From the comparison between the results shown in FIGS. 18A and 18B, it is apparent that a variation in equipotential lines 524 in FIG. 18A is larger than that in FIG. 18B. That is to say, as the irradiated position with the electron beam 503 becomes closer to the end portion of the wafer 510, the variation in equipotential lines 524 becomes larger to make higher the possibility of disturbance of the irradiated position with the electron beam 503. Accordingly, it must be avoided to provide a large space under the end portion of the wafer 510.

The above electric field simulation shows that if a high projection is provided outside an end portion of the wafer 510 or a space is provided under an end portion of the wafer 510, the outer limit of a range in which an irradiated position with the electron beam 503 is not disturbed is located at least 10 mm inwardly from the end portion of the wafer 510.

From the above electric field simulation, it is also apparent that in order to prevent a variation in electric field at an end portion of the wafer 510 and hence to prevent adverse effect exerted on an irradiated position with the electron beam 503, it is effective to make the height of a portion, around the end portion of the wafer 510, of the workpiece holder 521 equal to the surface height of the wafer 510.

Depending on errors caused at the machining and assembling steps, it is difficult to make the height of the wafer 510 perfectly equal to that of the workpiece holder 521; however, as the results of experiments performed by the present inventors, it is apparent that if a difference between heights of an end portion of the wafer 510 and workpiece holder 521 is ±200 $\mu$m, the adverse effect of such a difference in height exerted on an irradiated position with the electron beam 503 is almost negligible.

With respect to the gap 537 shown in FIGS. 12 and 13, which is formed between the wafer 510 and holding plate 521*b* (521*c*) resulting from the machining accuracy, the results of experiments performed by the present inventors show that if the gap 537 is 0.5 mm or less, the adverse effect of the gap 537 exerted on an irradiated position with the electron beam 503 is almost negligible.

In this way, the electron beam application apparatus including the function of controlling an irradiation energy of an electron beam with a retarding voltage may be configured to prevent a variation in electric field by making the height of a workpiece nearly equal to that of a workpiece holder, setting a dimensional tolerance with respect to a difference in height between the workpiece and workpiece holder, or providing a range of the workpiece in which the heights are nearly equal to each other. This makes it possible to irradiate an end portion of the workpiece with the electron beam without reducing the accuracy of an irradiated position with the electron beam.

As described above, the electron beam application apparatus according to the present invention, which includes the function of controlling an irradiation energy of an electron beam with a retarding voltage, exhibits the effect of irradiating a workpiece with an electron beam without reducing the accuracy of an irradiated position with the electron beam.

What is claimed is:

1. A calibrating substrate for calibrating heights of a sample comprising:
    at least two kinds of surfaces having different heights; and
    standard marks substantially similar to each other, said standard marks being provided on said two surfaces having different heights, respectively,
    wherein a range of each of the surface heights of the standard marks is set at a value nearly equal to a variation range of the surface height of the sample caused by warping of the sample.

2. A method of calibrating heights of a sample comprising:
    setting a calibrating substrate on a stage;
    irradiating a charged particle beam onto standard marks provided on at least two kinds of surfaces having different substrate heights;
    detecting secondary charged particles produced from said irradiated standard marks on the substrate; and
    measuring a surface height of the irradiated portion of the substrate,
    wherein a range of each of the surface heights of the standard marks is set at a value nearly equal to a variation range of the surface height of the sample caused by warping of the sample.

* * * * *